US011283041B2

(12) United States Patent
Lee et al.

(10) Patent No.: US 11,283,041 B2
(45) Date of Patent: Mar. 22, 2022

(54) DISPLAY DEVICE AND METHOD FOR MANUFACTURING THE SAME

(71) Applicant: Samsung Display Co., Ltd., Yongin-si (KR)

(72) Inventors: Yeonhwa Lee, Hwaseong-si (KR); Jaesik Kim, Hwaseong-si (KR); Jaeik Kim, Seoul (KR); Joongu Lee, Seoul (KR); Sehoon Jeong, Suwon-si (KR); Jiyoung Choung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/696,258

(22) Filed: Nov. 26, 2019

(65) Prior Publication Data
US 2020/0243790 A1 Jul. 30, 2020

(30) Foreign Application Priority Data

Jan. 28, 2019 (KR) .......................... 10-2019-0010691

(51) Int. Cl.
H01L 51/52 (2006.01)
H01L 27/32 (2006.01)

(52) U.S. Cl.
CPC ...... H01L 51/5203 (2013.01); H01L 27/3246 (2013.01); H01L 51/5256 (2013.01); H01L 2251/305 (2013.01)

(58) Field of Classification Search
None
See application file for complete search history.

(56) References Cited

U.S. PATENT DOCUMENTS

| 8,957,413 | B2* | 2/2015 | Song | H01L 51/5228 |
| | | | | 257/40 |
| 8,994,010 | B2* | 3/2015 | Choi | H01L 51/5008 |
| | | | | 257/40 |
| 9,088,004 | B2* | 7/2015 | Chung | H01L 27/326 |
| 9,231,030 | B2* | 1/2016 | Choi | H01L 27/3279 |
| 9,231,211 | B2 | 1/2016 | Lee et al. | |
| 9,287,339 | B2* | 3/2016 | Lee | H01L 51/5221 |
| 9,331,308 | B2* | 5/2016 | Choi | H01L 51/0052 |

(Continued)

FOREIGN PATENT DOCUMENTS

JP 3302262 B2 7/2002

Primary Examiner — Julio J Maldonado
Assistant Examiner — Lawrence C Tynes, Jr.
(74) Attorney, Agent, or Firm — Lewis Roca Rothgerber Christie LLP

(57) ABSTRACT

A display device includes: a circuit element layer comprising a transistor; a display element layer comprising a first electrode connected to the transistor, a second electrode facing the first electrode, an organic pattern between the first electrode and the second electrode, a pixel defining layer having an opening exposing the first electrode, an auxiliary electrode spaced apart from the opening to cover a portion of the pixel defining layer and connected to the second electrode, a first protection pattern covering the second electrode, and a second protection pattern covering the first protection pattern; and an encapsulation layer covering the display element layer, wherein the first protection pattern and the second protection pattern have stress in directions different from each other.

17 Claims, 17 Drawing Sheets

(56) References Cited

U.S. PATENT DOCUMENTS

| | | | |
|---|---|---|---|
| 2005/0024339 A1* | 2/2005 | Yamazaki | H01L 27/3267 345/169 |
| 2007/0241664 A1* | 10/2007 | Sakamoto | H01L 27/3276 313/503 |
| 2015/0008458 A1* | 1/2015 | Yamazaki | H01L 27/3216 257/89 |
| 2017/0104181 A1* | 4/2017 | Lee | H01L 27/3246 |
| 2018/0153006 A1* | 5/2018 | Ishida | H05B 33/04 |
| 2018/0226581 A1* | 8/2018 | Chang | C09K 11/06 |
| 2019/0165295 A1* | 5/2019 | Toyoda | H01L 51/5088 |
| 2020/0227673 A1* | 7/2020 | Chang | H01L 51/001 |

* cited by examiner

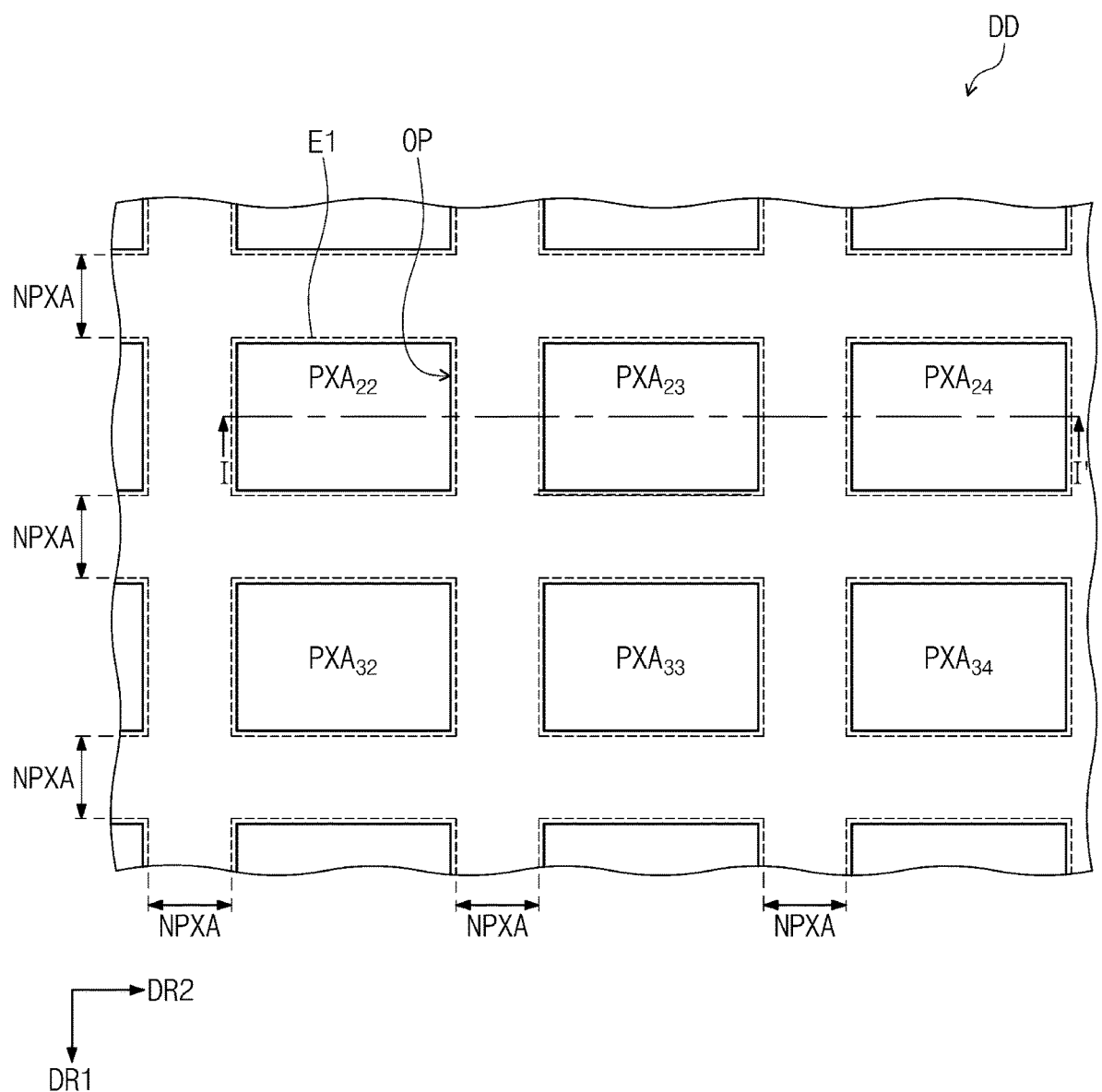

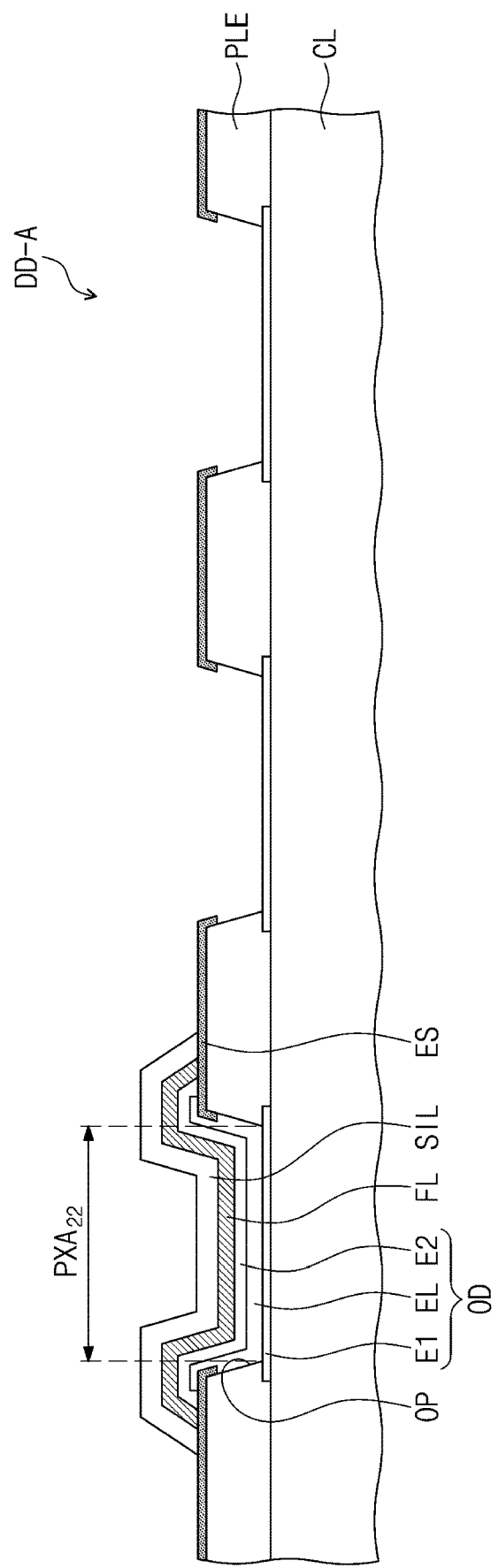

DISPLAY DEVICE AND METHOD FOR MANUFACTURING THE SAME

CROSS-REFERENCE TO RELATED APPLICATION

This application claims priority to and the benefit of Korean Patent Application No. 10-2019-0010691, filed on Jan. 28, 2019, the entire contents of which are hereby incorporated by reference.

BACKGROUND

Aspects of some example embodiments of the present disclosure herein relate to a display device and a method for manufacturing the same.

With the development of technology, portable thin flat panel display devices have become a popular type of display device. Among flat panel display devices, light emitting display devices have relatively wide viewing angles, relatively good contrast, and relatively fast response speeds as self-luminous display devices and thus have been attracting attention as next generation display devices. Also, organic light emitting display devices in which an organic light emitting layer is made of an organic material have relatively good luminance, driving voltage, and response speed characteristics as compared with inorganic light emitting display devices and also may be polychrome.

Such an organic light emitting display device includes pixels that emit red, green, and blue visible light to realize a natural color screen. An organic light emitting layer that emits the red visible light is formed in a red pixel, an organic light emitting layer that emits the green visible light is formed in the green pixel, and an organic layer that emits the blue visible light is provided in the blue pixel.

Here, if the organic light emitting layer is not formed to correspond to only the desired pixel but is also formed in another sub-pixel, the organic light emitting layer that emits different colors may be mixed, which may reduce image quality of the organic light emitting display device.

The above information disclosed in this Background section is only for enhancement of understanding of the background and therefore it may contain information that does not constitute prior art.

SUMMARY

Aspects of some example embodiments of the present disclosure herein relate to a display device and a method for manufacturing the same, and for example, to a display device having improved process reliability and a method for manufacturing the same.

Aspects of some example embodiments of the present disclosure include a display device including a protection layer located on an organic light emitting element to provide an organic light emitting element having relatively improved durability. Therefore, the corresponding display device may also have relatively improved reliability.

According to some example embodiments of the inventive concept, a display device includes: a circuit element layer including a transistor; a display element layer including a first electrode connected to the transistor, a second electrode facing the first electrode, an organic pattern between the first electrode and the second electrode, a pixel defining layer in which an opening exposing the first electrode is defined, an auxiliary electrode spaced apart from the opening to cover a portion of the pixel defining layer and connected to the second electrode, a first protection pattern covering the second electrode, and a second protection pattern covering the first protection pattern; and an encapsulation layer covering the display element layer, wherein the first protection pattern and the second protection pattern have stress in directions different from each other.

According to some example embodiments, the first protection pattern may include a transparent conductive material.

According to some example embodiments, the second protection pattern may include an inorganic material.

According to some example embodiments, the first protection pattern may have tensile stress, and the tensile stress of the first protection pattern may range from 0 Mpa to 200 Mpa.

According to some example embodiments, the second protection pattern may have compressive stress, and the compressive stress of the second protection pattern may range from −200 Mpa to 0 Mpa.

According to some example embodiments, the first protection pattern may have a thickness greater than that of the second electrode and less than that of the second protection pattern.

According to some example embodiments, the first protection pattern may have a thickness of 500 Å to 3,000 Å, and the second protection pattern may have a thickness of 3,000 Å to 20,000 Å.

According to some example embodiments, the encapsulation layer may include a first encapsulation inorganic layer, a second encapsulation inorganic layer, and an encapsulation organic layer between the first encapsulation inorganic layer and the second encapsulation inorganic layer, each of which contains an inorganic material, and the first encapsulation inorganic layer may contact the second protection pattern and a portion of the auxiliary electrode, which is exposed from the second protection pattern.

According to some example embodiments, the auxiliary electrode may include a lower portion contacting the pixel defining layer and an upper portion facing the lower portion, and a portion of the upper portion may be covered by the encapsulation layer.

According to some example embodiments, the remaining portion of the upper portion may be covered by a portion of each of the organic pattern, the second electrode, the first protection pattern, and the second protection pattern.

According to some example embodiments, surface areas may gradually increase in order of the organic pattern, the second electrode, the first protection pattern, and the second protection pattern.

According to some example embodiments, each of the pixel defining layer and the auxiliary electrode may have an island pattern shape on a plane.

According to some example embodiments, the pixel defining layer may include a lower portion adjacent to the transistor, an upper portion facing the lower portion, and a side portion connecting the lower portion to the upper portion, and the auxiliary electrode may cover the upper and at least a portion of the side portion.

According to some example embodiments of the inventive concept, a display device includes: a circuit element layer including a transistor; a display element layer including a first electrode connected to the transistor, a second electrode facing the first electrode, an organic pattern between the first electrode and the second electrode, a pixel defining layer in which an opening exposing the first electrode is defined, an auxiliary electrode spaced apart from the opening to cover a portion of the pixel defining layer and connected to the second electrode, a first protection pattern covering the second electrode, and a second protection pattern covering the first protection pattern; and an encapsulation layer covering the display element layer, wherein the first protection pattern includes transparent conductive oxide, and the second protection pattern includes an inorganic material.

According to some example embodiments, the first protection pattern and the second protection pattern may have stress different from each other.

According to some example embodiments, the first protection pattern may have a thickness less than that of the second protection pattern.

According to some example embodiments, the first protection pattern may have a thickness of 500 Å to 3,000 Å, and the second protection pattern may have a thickness of 3,000 Å to 20,000 Å.

According to some example embodiments, the transparent conductive material may include at least one of zinc oxide (ZnO), tin oxide ($SnO_2$), indium zinc oxide (IZO), indium tin oxide (ITO), or indium gallium oxide (IGO).

According to some example embodiments, the inorganic material may include at least one of silicon nitride ($SiN_x$), silicon oxynitride ($SiO_xN_y$), silicon oxide ($SiO_x$), silicon carbide ($SiC_x$), titanium oxide ($TiO_x$), zirconium oxide ($ZrO_x$), or zinc oxide ($ZnO_x$).

According to some example embodiments of the inventive concept, a method for manufacturing a display device includes: providing a preliminary display device including a circuit element layer on which a transistor is formed, a first electrode connected to the transistor, a pixel defining layer in which an opening exposing the first electrode is formed, and an auxiliary electrode covering a portion of the pixel defining layer; forming a lift-off layer covering the preliminary display device; forming a photoresist layer covering the lift-off layer; removing areas of the lift-off layer and the photoresist layer, which overlap the opening, to form an under cut; forming an organic pattern overlapping the opening, a second electrode covering the organic pattern and connected to the auxiliary electrode, a first protection pattern covering the second electrode, and a second protection pattern covering the first protection pattern; and removing the lift-off layer and the photoresist layer, wherein the first protection pattern and the second protection pattern have stress in directions different from each other.

BRIEF DESCRIPTION OF THE FIGURES

The accompanying drawings are included to provide a further understanding of the inventive concept, and are incorporated in and constitute a part of this specification. The drawings illustrate aspects of some example embodiments of the inventive concept and, together with the description, serve to explain principles of the inventive concept. In the drawings:

FIG. 3C is a schematic plan view illustrating a portion of a display panel according to some example embodiments of the inventive concept;

FIGS. 8A to 8J are cross-sectional views illustrating a method for manufacturing a display device according to some example embodiments of the inventive concept.

DETAILED DESCRIPTION

Figure 1:
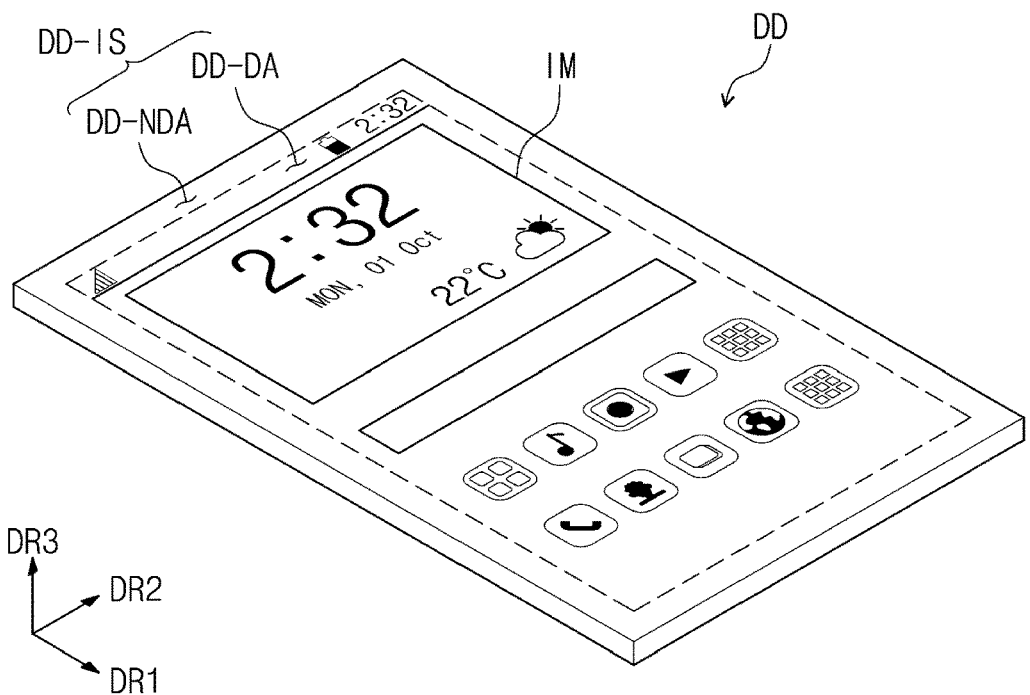
FIG. 1 is a perspective view of a display device according to some example embodiments of the inventive concept.

In this specification, it will also be understood that when one component (or region, layer, portion, etc.) is referred to as being cony, 'connected to', or 'coupled to' another component, it can be directly located/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, """under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of 'include' or 'comprise' specifies a property, a fixed number, a step, an operation, an element, a component or a combination thereof, but does not exclude other properties, fixed numbers, steps, operations, elements, components or combinations thereof. Hereinafter, aspects of some example embodiments of the inventive concept will be described with reference to the accompanying drawings.

Figure 2:
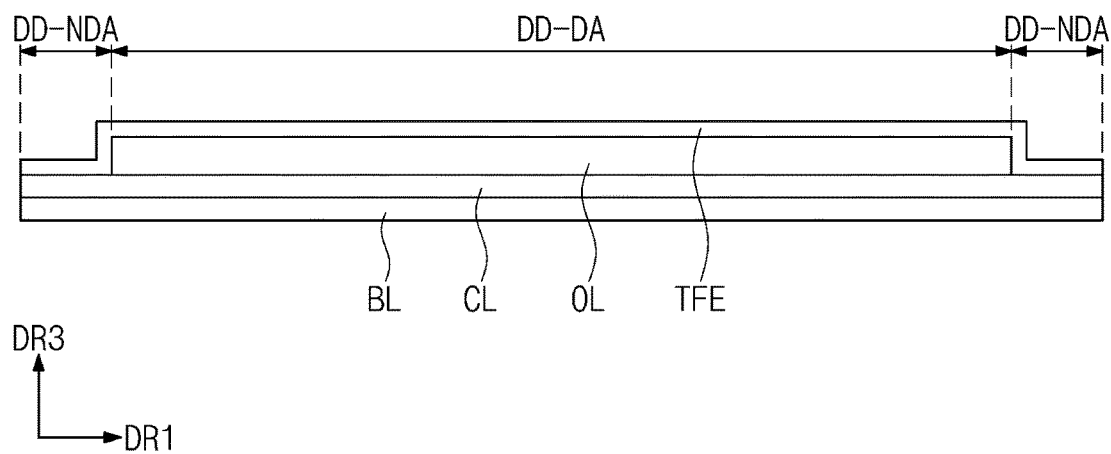
FIG. 2 is a cross-sectional view of the display device according to some example embodiments of the inventive concept.
Figure 3A:
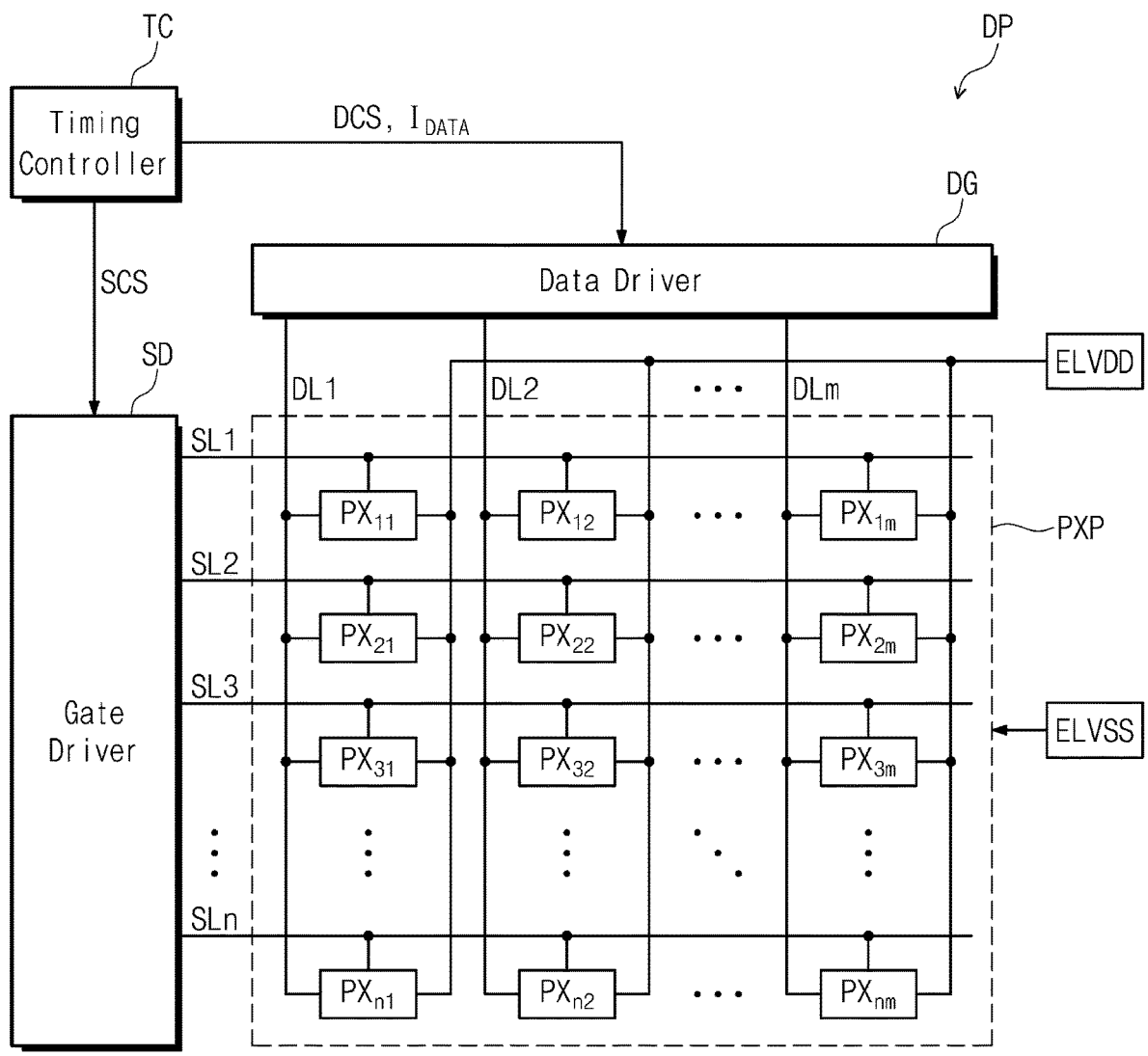
FIG. 3A is a block diagram of the display device according to some example embodiments of the inventive concept.
Figure 3B:
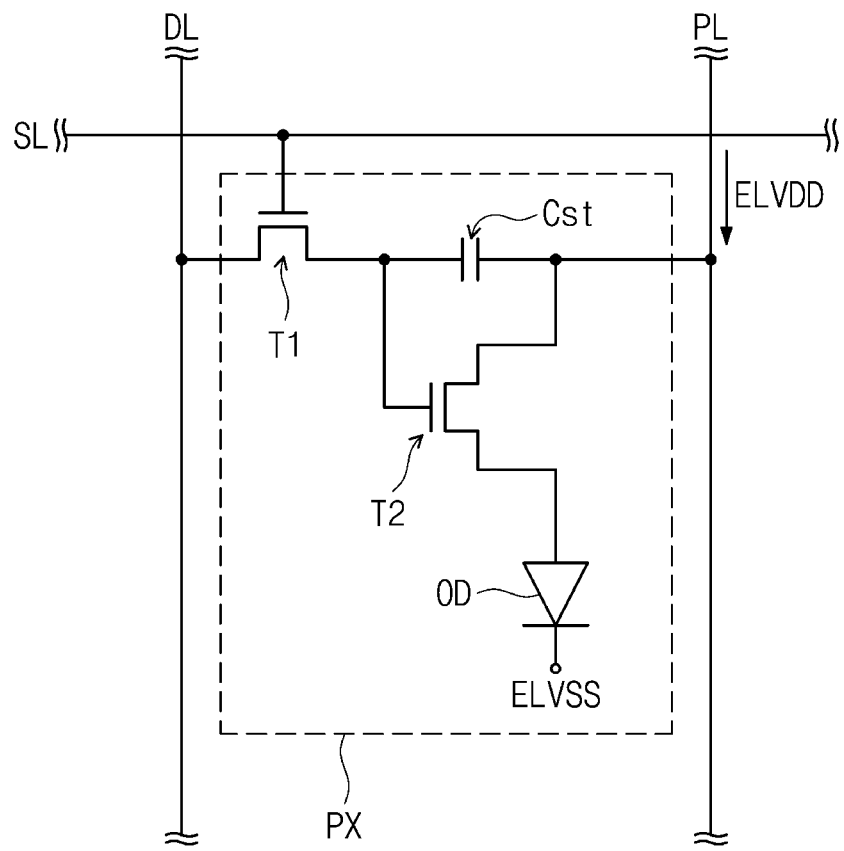
FIG. 3B is an equivalent circuit view of a pixel of FIG. 3A.
Figure 4:
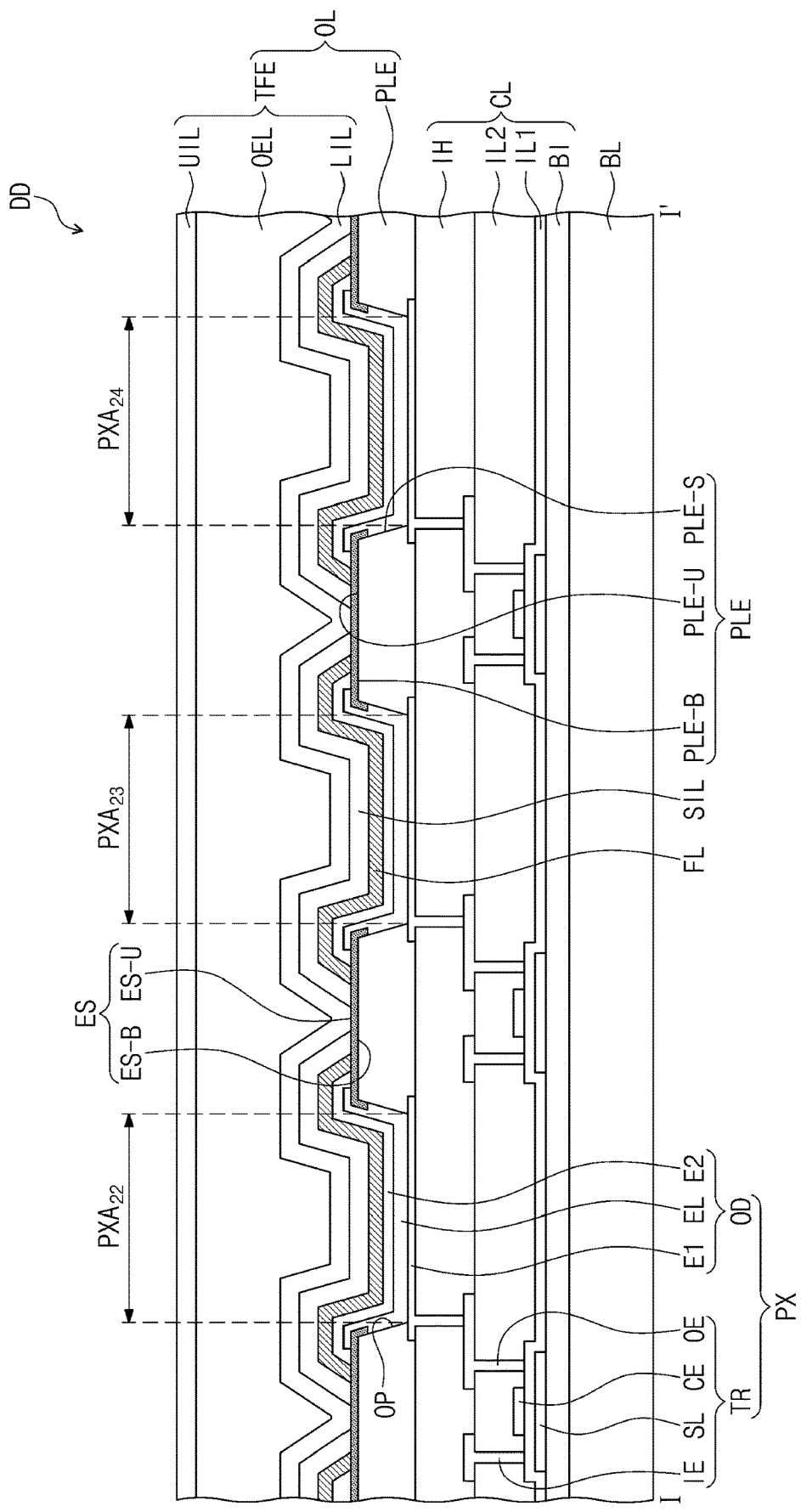
FIG. 4 is a cross-sectional view of a display device according to some example embodiments of the inventive concept.

FIG. 1 is a perspective view of a display device according to some example embodiments of the inventive concept. FIG. 2 is a cross-sectional view of the display device according to some example embodiments of the inventive concept. FIG. 3A is a block diagram of the display device according to some example embodiments of the inventive concept. FIG. 3B is an equivalent circuit view of a pixel of FIG. 3A. FIG. 3C is a schematic plan view illustrating a portion of a display panel according to some example embodiments of the inventive concept. FIG. 4 is a cross-sectional view of a display device according to some example embodiments of the inventive concept. Hereinafter, aspects of a display device according to some example embodiments of the inventive concept will be described with reference to FIGS. 1 to 4.

Referring to FIG. 1, a display device DD according to some example embodiments of the inventive concept may display an image IM through a display surface DD-IS. The display surface DD-IS is parallel to a surface defined by a first direction DR1 and a second direction DR2. A normal direction of the display surface DD-IS (i.e., a thickness direction of the display device DD) is indicated as a third direction DR3.

According to some example embodiments, the display apparatus DD that is capable of being applied to a mobile terminal is illustrated as an example. According to some example embodiments, electronic modules, a camera module, a power module, and the like, which are mounted on a main board, may be located on a bracket/case together with the display device DD to constitute the mobile terminal.

The display apparatus DD according to some example embodiments of the inventive concept may be applied to large-sized electronic apparatuses such as televisions and monitors and small and middle-sized electronic apparatuses such as tablet PC, navigation units for vehicles, game consoles, and smart watches.

An active area DD-DA according to some example embodiments of the inventive concept may have a rectangular shape. An non-active area DD-NDA is adjacent to the active area DD-DA. The non-active area DD-NDA may surround the active area DD-DA. However, the embodiments of the inventive concept are not limited thereto. For example, the active area DD-DA and the non-active area DD-NDA may be relatively designed in shape, and also, the non-active area DD-NDA may be omitted.

Referring to FIG. 2, the display device DD includes a base layer BL, a circuit element layer CL, a display element layer OL, and an encapsulation layer TFE.

The base layer BL may be a base layer on which other constituents of the display device DD are located. The base layer BL may include a synthetic resin layer. The synthetic resin layer may be located on a working substrate that is used for manufacturing the display device DD. Thereafter, a conductive layer, an insulation layer, and the like may be located on the synthetic resin layer. When the working substrate is removed, the synthetic resin layer corresponds to the base layer BL. The synthetic resin layer may be a flexible polyimide-based resin layer. In addition, the base layer BL may include a rigid glass substrate, a metal substrate, or an organic/inorganic composite material substrate, but is not limited to a specific embodiment.

The circuit element layer CL is located on the base layer BL. The circuit element layer CL includes at least one insulation layer and a circuit element. The insulation layer provided in the circuit element layer CL includes at least one inorganic layer and/or at least one organic layer. The circuit element includes the signal line and the driving circuit of the pixel. The circuit element layer CL may be formed through a process of forming an insulation, a semiconductor layer, and a conductive layer by coating or deposition and a process of patterning the insulation, the semiconductor layer, and the conductive layer by a photolithography process.

The display element layer OL is located on the circuit element layer CL and electrically connected to the circuit element layer CL. The display element layer OL includes an organic light emitting element OD (see, e.g., FIG. 4) that will be described in more detail later. The display element layer OL may include an organic layer such as a pixel defining layer PLE (see, e.g., FIG. 4) that will be described in more detail later.

The encapsulation layer TFE is located on the display element layer OL. The encapsulation layer TFE covers the display element layer OL to block moisture and oxygen, which are introduced from the outside, thereby protecting the display element layer OL. The encapsulation layer TFE may be provided in the form of a thin film including a plurality of inorganic layers and organic layers.

As illustrated in FIG. 3A, the display device DD includes a timing controller TC, a gate driver SD, a data driver DG, and a pixel area PXP. However, this is merely an example. According to some example embodiments, at least one of the timing controller TC, the gate driver SD, or the data driver DG may be separately provided with respect to the display device DD. The timing controller TC, the gate driver SD, the data driver DG, and the pixel area PXP according to some example embodiments may be located on the pixel element layer CL.

The timing controller TC receives input image signals to output image data IDTA and various control signals SCS and DCS, which are converted to match an operation mode of the display device DD.

The gate driver GC receives the gate driving control signal SCS from the signal control unit SC. The gate driver SD receiving the gate driving control signal SCS generates a plurality of gate signals. The gate signals are successively supplied to the display device DD.

The data driver DG receives the data driving control signal DCS and the converted image data IDATA from the timing controller TC. The data driver DC generates a plurality of data signals on the basis of the data driving control signal DCS and the converted image data DATA. The data signals are supplied to the display device DD.

The display device DD receives an electrical signal from the outside to display an image. The display device DD includes a plurality of gate lines SL1 to SLn, a plurality of data lines DL1 to DLm, and a plurality of pixels $PX_{11}$ to $PX_{nm}$.

The gate lines SL1 to SLn are arranged in the first direction DR1 to extend in the second direction DR2 crossing the first direction DR1. The gate lines SL1 to SLn successively receive the gate signals from the gate driver SD.

The data lines DL1 to DLm cross the gate lines SL1 to SLn so as to be insulated from the gate lines SL1 to SLn. The data lines DL1 to DLm extend in the first direction DR1 and are arranged in the second direction DR2. The data lines DL1 to DLm receive the data signals from the gate driver SD.

The display device DD receives a first power voltage ELVDD and a second power voltage ELVSS from the outside. Each of the pixels $PX_{11}$ to $PX_{nm}$ is turned on in response to the corresponding gate signal. Each of the pixels $PX_{11}$ to $PX_{nm}$ receives the first power voltage ELVDD and the second power voltage ELVSS to generate light in response to the corresponding data signal. The first power voltage ELVDD is a voltage having a level greater than that of the second power voltage ELVSS.

The pixels $PX_{11}$ to $PX_{nm}$ are connected to the corresponding gate lines of the gate lines SL1 to SLn and are connected to the corresponding data lines of the data lines DL1 to DLm.

Each of the pixels $PX_{11}$ to $PX_{nm}$ receives the gate signal from the corresponding gate line and the data signal from the corresponding data line. Each of the pixels $PX_{11}$ to $PX_{nm}$ is turned on in response to the corresponding gate signal.

Each of the pixels $PX_{11}$ to $PX_{nm}$ generates light corresponding to the corresponding data signal to display an image.

Each of the pixels $PX_{11}$ to $PX_{nm}$ includes at least one transistor, at least one capacitor, and an organic light emitting element. FIG. 3B illustrates an example of an equivalent circuit of one pixel PX connected to one gate line SL of the gate lines SL1 to SLn, one data line DL of the data lines DL1 to DLm, and the power line PL.

The pixel PX includes a first transistor T1, a second transistor T2, a capacitor Cst, and an organic light emitting element OD. The first transistor T1 includes an input electrode and an output electrode. The first transistor T1 outputs a data signal applied to the data line DL, which corresponds to the gate signal applied to the gate line GL.

The capacitor Cst includes a first capacitor electrode connected to the first transistor T1 and a second capacitor electrode receiving the first power voltage ELVDD. The capacitor Cst charges electric charges that correspond to a difference between a voltage corresponding the data signal received from the first transistor T1 and the first power voltage ELVDD.

The second transistor T2 includes a control electrode connected to the output electrode of the first transistor T1 and the first capacitor electrode of the capacitor Cst, an input electrode receiving the first power voltage ELVDD through the power line PL, and an output electrode. The output electrode of the second transistor T2 is connected to the organic light emitting element OD.

The second transistor T2 corresponds to the electric charges stored in the capacitor Cst to control driving current flowing through the organic light emitting element OD. A turn-on time of the second transistor T2 is determined according to an amount of electric charges charged in the capacitor Cst. Substantially, the output electrode of the second transistor T2 supplies a voltage having a level less than that of the first power voltage ELVDD to the organic light emitting device OD.

The organic light emitting device OD includes a first electrode connected to the second transistor T2 and a second electrode receiving the second power voltage ELVSS. The organic light emitting device OD may include a light emitting pattern located between the first and second electrodes.

The organic light emitting device OD emits light in the turn-on period of the second transistor T2. The light generated in the organic light emitting device OD may have a color that is determined by a material for forming the light emitting pattern. For example, the light generated in the organic light emitting device OD may have one of a red color, a green color, a blue color, and a white color.

Referring to FIG. 3C, the display device DD may be divided into a plurality of emission areas through which the light generated from the organic light emitting element OD is emitted and a non-emission area that is adjacent to the emission areas. FIG. 3C illustrates an area including some emission areas $PXA_{22}$, $PXA_{23}$, $PXA_{24}$, $PXA_{32}$, $PXA_{33}$, and $PXA_{34}$ of the emission areas.

The emission areas $PXA_{22}$, $PXA_{23}$, $PXA_{24}$, $PXA_{32}$, $PXA_{33}$, and $PXA_{34}$ are spaced apart from each other with the non-emission area NPXA. The emission areas $PXA_{22}$, $PXA_{23}$, $PXA_{24}$, $PXA_{32}$, $PXA_{33}$, and $PXA_{34}$ may be arranged in various shapes. For example, the emission areas $PXA_{22}$, $PXA_{23}$, $PXA_{24}$, $PXA_{32}$, $PXA_{33}$, and $PXA_{34}$ may be arranged in the form of a matrix. Thus, the non-emission area NPXA may have a lattice shape. However, this is merely an example. The arrangement of the emission areas $PXA_{22}$, $PXA_{23}$, $PXA_{24}$, $PXA_{32}$, $PXA_{33}$, and $PXA_{34}$ is not limited to a specific embodiment.

The emission areas $PXA_{22}$, $PXA_{23}$, $PXA_{24}$, $PXA_{32}$, $PXA_{33}$, and $PXA_{34}$ may correspond to a plurality of openings OP provided in the pixel defining layer PLE Also, the emission areas $PXA_{22}$, $PXA_{23}$, $PXA_{24}$, $PXA_{32}$, $PXA_{33}$, and $PXA_{34}$ are located to overlap a first electrode E1 (see, e.g., FIG. 4) of the organic light emitting element OD (see, e.g., FIG. 4), which will be described in more detail later. In FIG. 3C, the first electrode E1 overlapping the emission areas $PXA_{22}$, $PXA_{23}$, $PXA_{24}$, $PXA_{32}$, $PXA_{33}$, and $PXA_{34}$ is illustrated as a dotted line.

FIG. 4 illustrates a cross-sectional view of some areas of the emission areas $PXA_{22}$, $PXA_{23}$, $PXA_{24}$, $PXA_{32}$, $PXA_{33}$, and $PXA_{34}$. The circuit electrode layer CL may include a transistor TR and a plurality of insulation layers BI, IL1 IL2, and IH. The circuit element layer CL is located on the base layer BL.

The barrier layer BI is located on the base layer BL. The barrier layer BI may cover the base layer BL. The barrier layer BI may be an insulation layer including an inorganic material. For example, the barrier layer BI may include at least one of aluminum oxide ($AlO_x$), titanium oxide ($TiO_x$), silicon oxide ($SiO_x$), silicon oxynitride ($SiO_xN_y$), zirconium oxide ($ZrO_x$), or hafnium oxide ($HfO_x$). The barrier layer BI may be provided as a multilayered inorganic layer. The barrier layer BI may prevent or reduce instances of foreign substances being introduced from the outside.

According to some example embodiments, the display device DD may further include a buffer layer. The buffer layer may be located on the barrier layer BI. The buffer layer may include an inorganic material or an organic material. The buffer layer may prevent or reduce instances of impurities, moisture, or external air, which may deteriorate characteristics of the semiconductor pattern SL, which will be described later, being permeated and also planarize a surface. Thus, the circuit element layer CL may be stably formed on the base layer BL.

The transistor TR includes a semiconductor pattern SL, a control electrode CE, an input electrode IE, and an output electrode OE. The transistor TR controls movement of charges in the semiconductor pattern SL through the control electrode CE to output an electrical signal inputted from the input electrode IE through the output electrode OE. FIG. 4 illustrates a second transistor T2 of the transistors TR1 and TR2 illustrated in FIG. 3B, i.e., one transistor TR corresponding to the driving transistor.

The semiconductor pattern SL is located on the barrier BI. The semiconductor pattern SL may include at least one of a crystalline semiconductor material, a metal oxide semiconductor material, polycrystalline silicon, or amorphous silicon. Although the control electrode CE is located on the semiconductor pattern SL in the transistor TR according to some example embodiments of the inventive concept, the embodiment of the inventive concept is not limited thereto. For example, the transistor TR may have a bottom-gate structure in which the control electrode CE is located on the base layer BL and covered by the first insulation layer IL1, and the semiconductor pattern SL is located on the first insulation layer IL1, but is not limited to a specific embodiment.

The first insulation layer IL1 may be located between the semiconductor pattern SL and the control electrode CE. The first insulation layer IL1 covers the base layer BL and the semiconductor pattern SL. The first insulation layer IL1 includes an inorganic material, but is not limited to a specific embodiment.

The control electrode CE is located on the semiconductor pattern SL. The control electrode CE is spaced apart from the semiconductor pattern SL with the first insulation layer IL1 therebetween. The control electrode CE may overlap the semiconductor pattern SL.

The second insulation layer IL2 may be located between the control electrode CE and the input electrode IE and between the control electrode CE and the output electrode OE. The second insulation layer IL2 covers the first insulation layer IL1 and the control electrode CE. The second insulation layer IL2 includes an inorganic material, but is not limited to a specific embodiment.

The input electrode IE and the output electrode OE are located on the second insulation layer IL2. Each of the input electrode IE and the output electrode OE is connected to the semiconductor pattern SL through the first insulation layer IL1 and the second insulation layer IL2. However, this is merely an example. For example, the input electrode IE and the output electrode OE may be directly connected to the semiconductor pattern SL.

The third insulation layer IH is located on the second insulation layer IL2. The third insulation layer IH may cover the transistor TR. The third insulation layer IH may be located between the transistor TR and the display element layer PL to electrically insulate the transistor TR from the display element layer PL.

The display element layer OL includes the pixel defining layer PLE, the organic light emitting element OD, an auxiliary electrode ES, a first protection pattern FL, and a second protection pattern SIL.

The pixel defining layer PLE is located on the third insulation layer IH. An opening OP may be defined in the pixel defining layer PLE. The pixel defining layer PLE includes an upper portion PLE-U, a lower portion PLE-B facing the upper portion PLE-U, and a side portion PLE-S connecting the upper portion PLE-U to the lower portion PLE-B. The opening OP may be defined from the side portion PLE-S that passes through the fixing defining PLE so as to be exposed.

According to some example embodiments, the side portion PLE-S may be inclined . . . toward the upper portion PLE-U of the pixel defining layer PLE on the first electrode E1. Thus, a cross-section of the opening OP may have a trapezoid shape. However, this is merely an example. For example, the side portion PLE-S may be perpendicular to the first electrode E1 and the upper portion PLE-U, but is not limited to a specific embodiment.

The opening OP may expose a portion of the first electrode E1. According to some example embodiments, the opening OP may be provided in plurality to overlap the corresponding first electrodes. Substantially, the openings may correspond to the emission areas $PXA_{22}$, $PXA_{23}$, $PXA_{24}$, $PXA_{32}$, $PXA_{33}$, and $PXA_{34}$ that are described with reference to FIG. 3C.

The organic light emitting element OD may include a first electrode E1, a second electrode E2, and an organic pattern EL. The organic light emitting element OD overlaps the active area DD-DA. According to some example embodiments, the organic light emitting element OD may further include a hole control layer.

The first electrode E1 is located on the third insulation layer IH. The first electrode E1 may pass through the third insulation layer IH and then be electrically connected to the transistor TR. The first electrode E1 may be provided in plurality. The plurality of first electrodes may be arranged to overlap the corresponding emission areas of the emission areas $PXA_{22}$, $PXA_{23}$, $PXA_{24}$, $PXA_{32}$, $PXA_{33}$, and $PXA_{34}$ that are described with reference to FIG. 3C.

The second electrode E2 is located on the first electrode E1. The second electrode E2 is located to face the first electrode E1. The second electrode E2 according to some example embodiments may be arranged to overlap the corresponding first electrode E1. The second electrode E2 may be provided in plurality. The plurality of second electrodes may have an island pattern shape. Thus, the second electrodes may be arranged to overlap the corresponding first electrodes, respectively.

Each of the second electrode E2 may include optically transparent transmissive electrode. For example, the second electrode E2 may include at least one of indium zinc oxide (IZO), indium tin oxide (ITO), indium gallium oxide (IGO), indium zinc gallium oxide (IGZO), or a mixture/compound thereof. Thus, the display device DD displays an image on the front surface thereof. However, this is merely an example. For example, the second electrode E2 may be a reflective electrode or a transflective electrode according to a direction in which the image is displayed.

An organic pattern EL is located between the first electrode E1 and the second electrode E2. The organic light emitting element OD may activate the organic pattern EL according to a potential difference between the first electrode E1 and the second electrode E2 to generate light. The organic pattern EL may be provided in plurality to overlap the corresponding first and second electrodes.

The organic pattern EL according to some example embodiments may include a low or high molecular organic material. For example, when the red visible light is emitted from the organic pattern EL, the organic pattern EL may include tetraphenylnaphthacene (rubrene), tris(1-phenylisoquinoline) iridium(III) (Ir(piq) 3), bis(2-benzo[b]thiophen-2-yl-pyridine)(acetylacetonate) iridium(III) (Ir(btp)2(acac)), tris(dibenzoylmethane)phenanthroline europium(III) (Eu (dbm)3(phen)), tris[4,4'-di-tert-butyl-(2,2')-bipyridine]ruthenium(III) complex (Ru(dtb-bpy)3*2(PF6)), DCM1, DCM2, Eu(thenoyltrifluoroacetone)3 (Eu(TTA)3), butyl-6-(1,1,7,7-tetramethylgulolidyl-9-enyl)-4H-pyran (butyl-6-(1,1,7,7-tetramethyljulolidyl-9-enyl)-4H-pyran: DCJTB), and the like and further includes polymer light emitting materials such as polyfluorene polymers, polyvinyl polymers, and the like.

In addition, in the case of the organic pattern EL emitting the green visible light, the organic pattern EL may include 3-(2-benzothiazolyl)-7-(diethylamino)coumarin6,2,3,6,7-tetrahydro-1,1,7,7,-tetramethyl-1H,5H,11H-10-(2-benzothiazolyl) quinolinone-[9,9a, 1gh] coumarin (C545T), N,N'-dimethyl-quinacridone (DMQA), tris(2-phenylpyridine) iridium(III) (Ir(ppy)3), and the like, which that are green emitting materials, and further include polymer light emitting materials such as polyfluorene polymers, polyvinyl polymers, and the like.

Also, in the case of the organic pattern EL emitting the blue visible light, the organic pattern EL may include oxadiazole dimer dyes (Bis-DAPDXP), spiro compounds (Spiro-DPVBi, Spiro-6P), triarylamine compounds, bis (styryl)amine (DPVBi, DSA), 4,4'-bis(9-ethyl-3-carbazovinylene)-1,1'-biphenyl (BCzVBi), perylene, 5,8,11-tetra-tert-butyl perylene (TPBe), carbazole-3,3'-(1,4-phenylene-di-2,1-ethen-diyl)bis[9-ethyl-(9C)] (BCzVB), 4,4-bis [4-(di-p-tolylamino)styryl]biphenyl (DPAVBi), 4-[(di-p-tolylam ino) styryl]stilbene (DPAVB), 4,4'-bis [4-(diphenylamino)styryl] biphenyl (BDAVBi), bis(3,5-difluoro-2-(2-pyridyl)phenyl- (2-carboxypyridyl) iridium III (FlrPic), and the like and further include polymer light emitting materials such as polyfluorene polymers, polyvinyl polymers, and the like.

The organic pattern EL according to some example embodiments may further include an electron control layer including a low molecular material. The electron control layer may include an electron transport layer and an electron injection layer.

According to some example embodiments, the organic light emitting element OD may further include a hole control layer. The hole control layer is located between the first electrode E1 and the organic pattern EL. The hole control layer may include a hole injection layer and a hole transport layer.

The hole control layer may have a single layer structure of the hole injection layer or the hole transport layer and also a single layer structure made of a hole injection material or a hole transport material. Also, the hole control layer may have a single layer structure formed of a plurality of different materials or a structure of the hole injection layer/the hole transport layer, the hole injection layer/the hole transport layer/the buffer layer, the hole injection layer/the hole buffer layer, the hole transport layer/the hole buffer layer, or the hole injection layer/the hole transport layer/the electron blocking layer, which are successively laminated from the first electrode E1, but is not limited thereto.

The auxiliary electrode ES may be located on the pixel defining layer PLE. For example, the auxiliary electrode ES may cover at least a portion of the side portion PLE-S and the upper portion PLE-U of the pixel defining layer PLE. The auxiliary electrode ES may include a lower portion ES-B contacting the pixel defining layer PLE and an upper portion ES-U facing the lower portion ES-B. The upper portion ES-U may contact the encapsulation layer TFE.

The auxiliary electrode ES may be provided in plurality. The plurality of auxiliary electrodes ES may be arranged in the form of a matrix because the auxiliary electrodes ES are located on the upper portion PLE-U of the corresponding pixel defining layer PLE.

The auxiliary electrode ES may be electrically connected to the second electrode E2 of the organic light emitting element OD. The auxiliary electrode ES may be located between the adjacent organic light emitting elements to electrically connect the second electrodes provided in the different organic light emitting elements to each other. According to some example embodiments, the plurality of second electrodes may have the island pattern shape. Thus, the second electrodes may be electrically connected to each other by the plurality of auxiliary electrodes. Thus, the second electrodes may serve as common electrodes.

A first protection pattern FL is located on the second electrode E2. The first protection pattern FL may cover the second electrode E2. Each of one end and a distal end of the first protection pattern FL may be connected to upper portions of the auxiliary electrodes different from each other.

The first protection pattern FL may be located on the second electrode E2 to improve light efficiency of the organic light emitting element OD. Also, the first protection pattern FL may serve to protect the organic light emitting element OD while the organic light emitting pattern OD is patterned.

The first protection pattern FL according to some example embodiments may include a transparent conductive material. For example, the first protection pattern FL may include at least one of zinc oxide (ZnO), tin oxide ($SnO_2$), indium zinc oxide (IZO), indium tin oxide (ITO), or indium gallium oxide (IGO). Thus, when the organic light emitting element ED is provided as a front emission type, light generated in the organic pattern EL may pass through the first protection pattern FL and then be transmitted to the outside.

The first protection pattern FL may include the transparent conductive material to complement the electrical connection between the second electrode E2 and the auxiliary electrode ES. For example, the second electrode E2 may not serve as the common electrode because of poor contact between the second electrode E2 and the auxiliary electrode ES while the second electrode E2 is formed. According to the inventive concept, the first protection pattern FL may contact the second electrode E2 and the adjacent auxiliary electrode to complement the electrical connection between the second electrode E2 and the auxiliary electrode ES, thereby providing the organic light emitting element OD having improved reliability.

The first protection pattern FL according to some example embodiments may have a thickness of about 500 Å to about 3,000 Å. When the first protection pattern FL has a thickness less than about 500 Å, the first protection pattern FL may serve to complement the electrical connection between the second electrode E2 and the auxiliary electrode E2. When the first protection pattern FL has a thickness exceeding about 3,000 Å, the thickness of the first protection pattern FL located on the organic pattern EL may increase to deteriorate the light efficiency. The first protection pattern FL may have a thickness greater than that of the organic pattern EL.

The second protection pattern SIL is located on the first protection pattern FL. The second protection pattern SIL may cover the first protection pattern FL. Each of one end and a distal end of the second protection pattern SIL may be connected to upper portions of the auxiliary electrodes different from each other. The second protection pattern SIL may cover the first protection pattern FL to seal the organic light emitting element OD together with the auxiliary electrode ES. Thus, the second protection pattern SIL may serve to protect constituents provided in the organic light emitting element OD against an external impact, an etching material, or external air when the organic light emitting element OD is formed.

The second protection pattern according to some example embodiments may include an inorganic material. For example, the second protection pattern SIL may include at least one of silicon nitride ($SiN_x$), silicon oxynitride ($SiO_xN_y$), silicon oxide ($SiO_x$), silicon carbide ($SiC_x$), titanium oxide ($TiO_x$), zirconium oxide ($ZrO_x$), or zinc oxide ($ZnO_x$).

The second protection pattern SIL according to some example embodiments may have a thickness of about 3,000 Å to about 20,000 Å. When the second protection pattern SIL has a thickness less than about 3,000 Å, the second protection pattern SIL may serve to protect constituents provided in the organic light emitting element OD against the external impact, the etching material, or the external air when the organic light emitting element OD is formed. When the second protection pattern SIL has a thickness exceeding about 20,000 Å, the thickness of the first protection pattern FL located on the organic pattern EL may increase to deteriorate the light efficiency. According to some example embodiments of the inventive concept, the first protection pattern FL may have a thickness less than that of the second protection pattern SIL.

The first protection pattern FL and the second protection pattern SIL according to the inventive concept may have stress in directions different from each other, respectively.

When the organic light emitting element OD is patterned to be formed, a photoresist process may be performed several times on an area overlapping the opening OP of the pixel defining layer PLE. Here, a lift-off layer LOL (see FIG. 8C) and a photoresist layer PR (see FIG. 8C), which are located on the circuit element layer CL, may be etched in an under cut shape to deposit the organic material, thereby forming the organic light emitting element OD.

Because the previously formed organic pattern EL is exposed to the atmosphere while the adjacent organic light emitting element is patterned, the organic pattern EL may seal the second protection pattern SIL to protect the organic pattern PL against the etching material or the external air.

The first protection pattern FL according to the inventive concept may have stress in a direction that is opposite to that of the second protection pattern SIL. For example, when the second protection pattern SIL has compressive stress under the same conditions, the first protection pattern FL may have tensile stress that is opposite to the compressive stress.

Figure 8A:
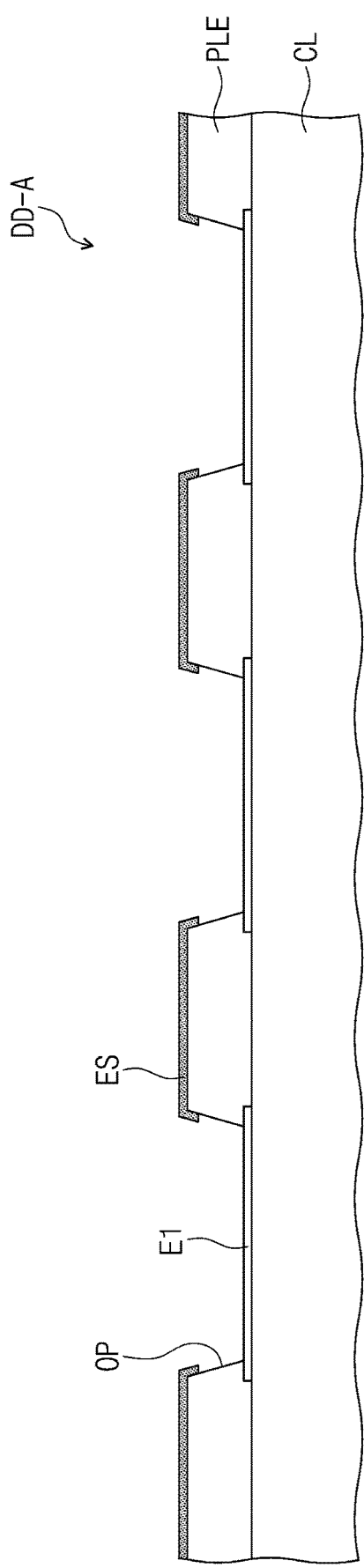
Figure 8B:
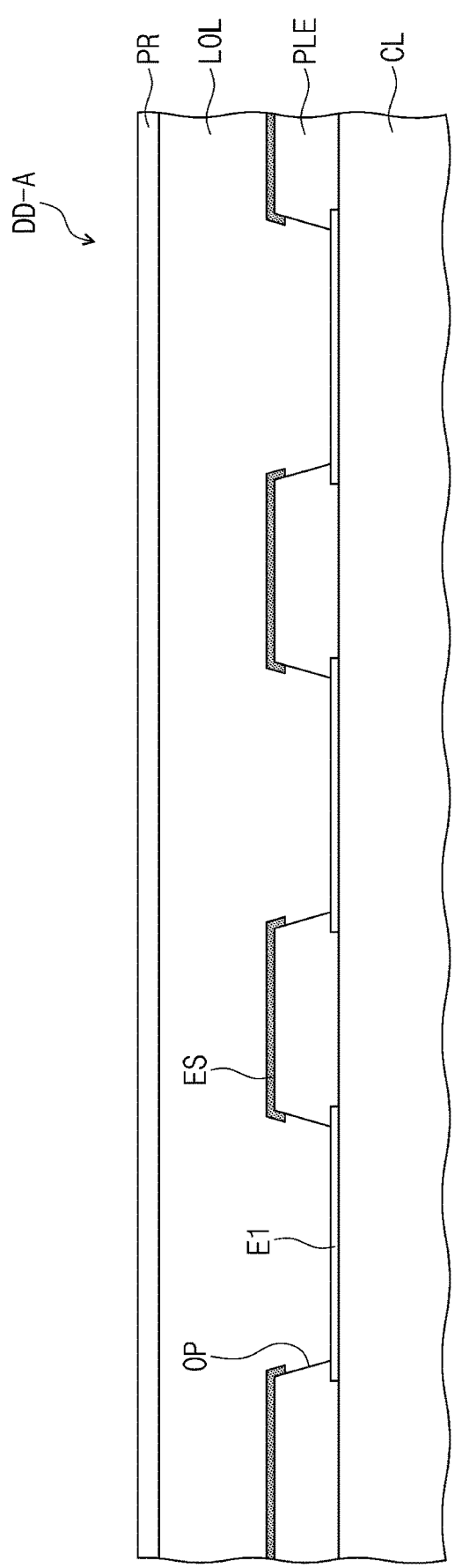
Figure 8C:
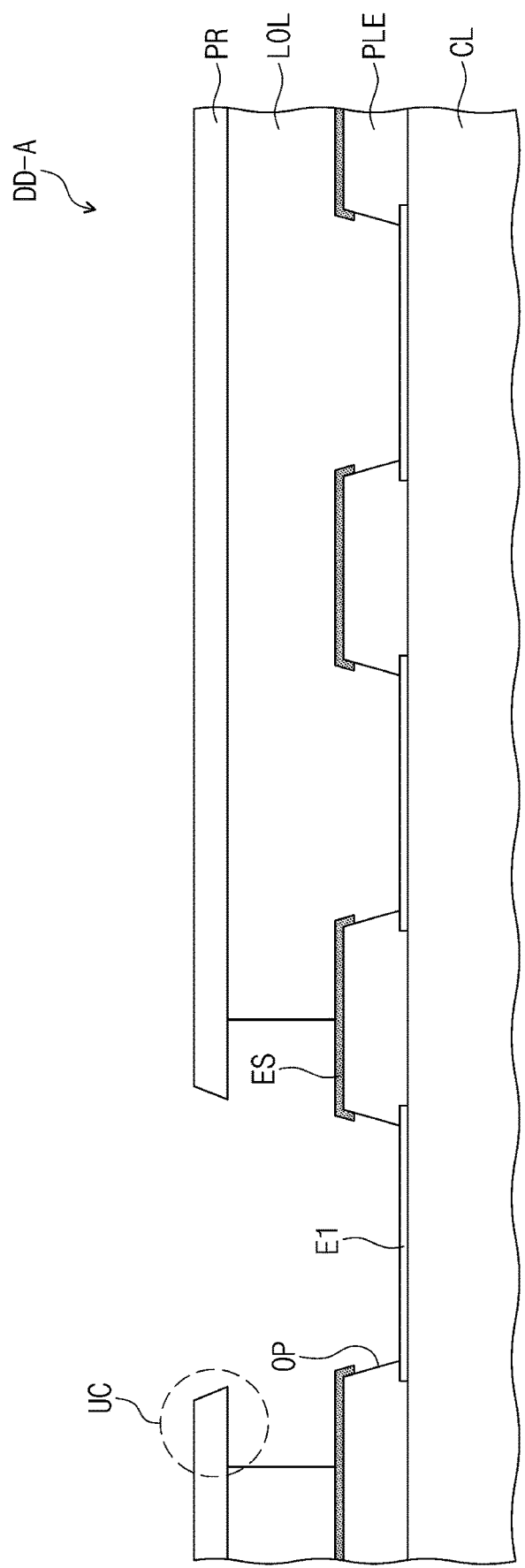
Figure 8D:
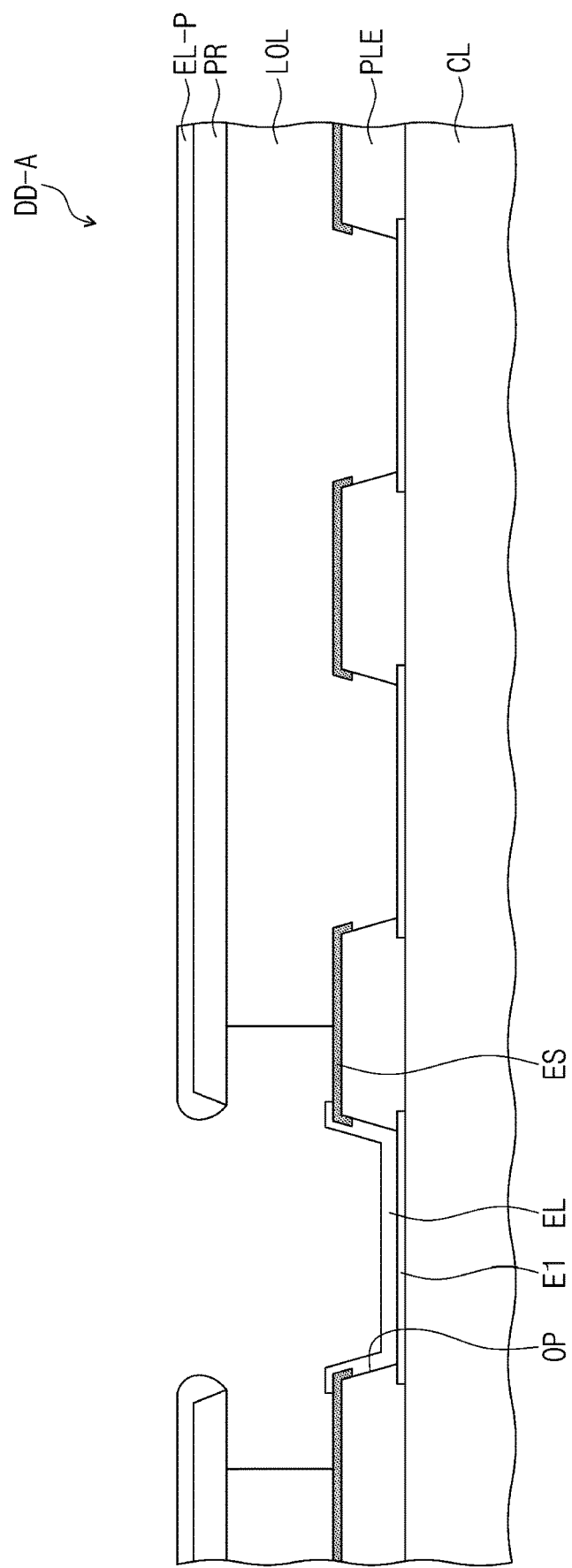
Figure 8E:
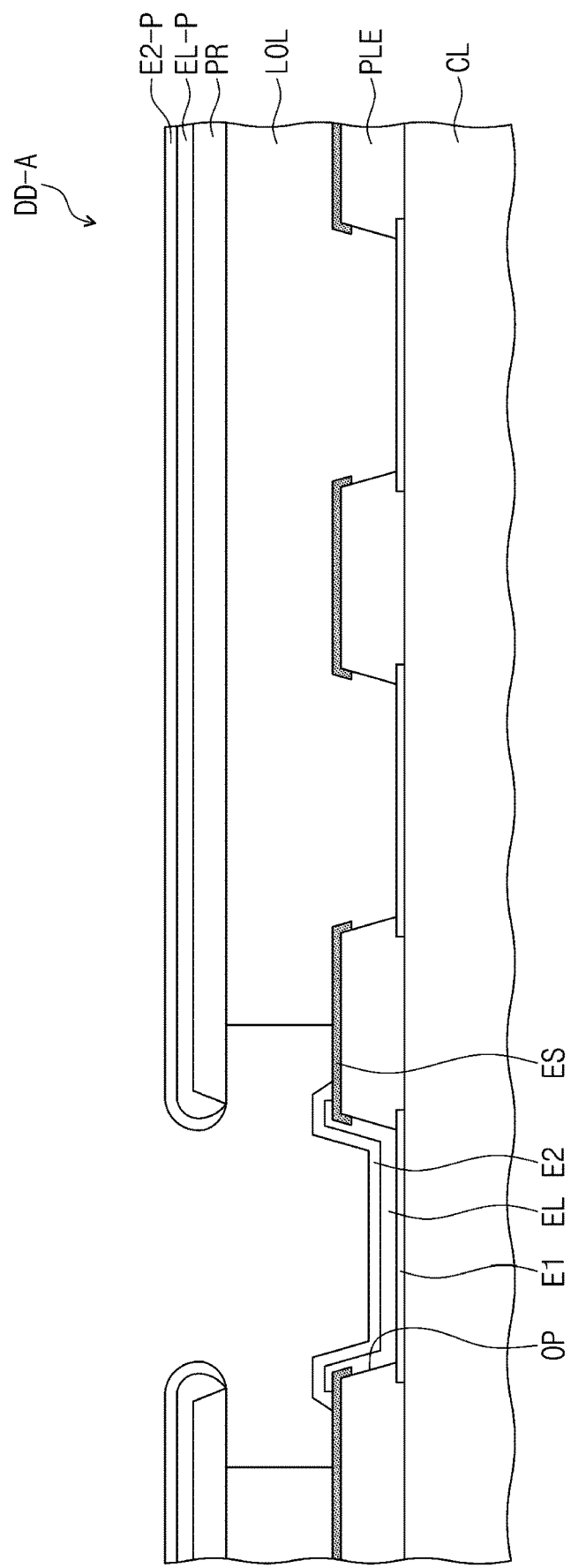
Figure 8F:
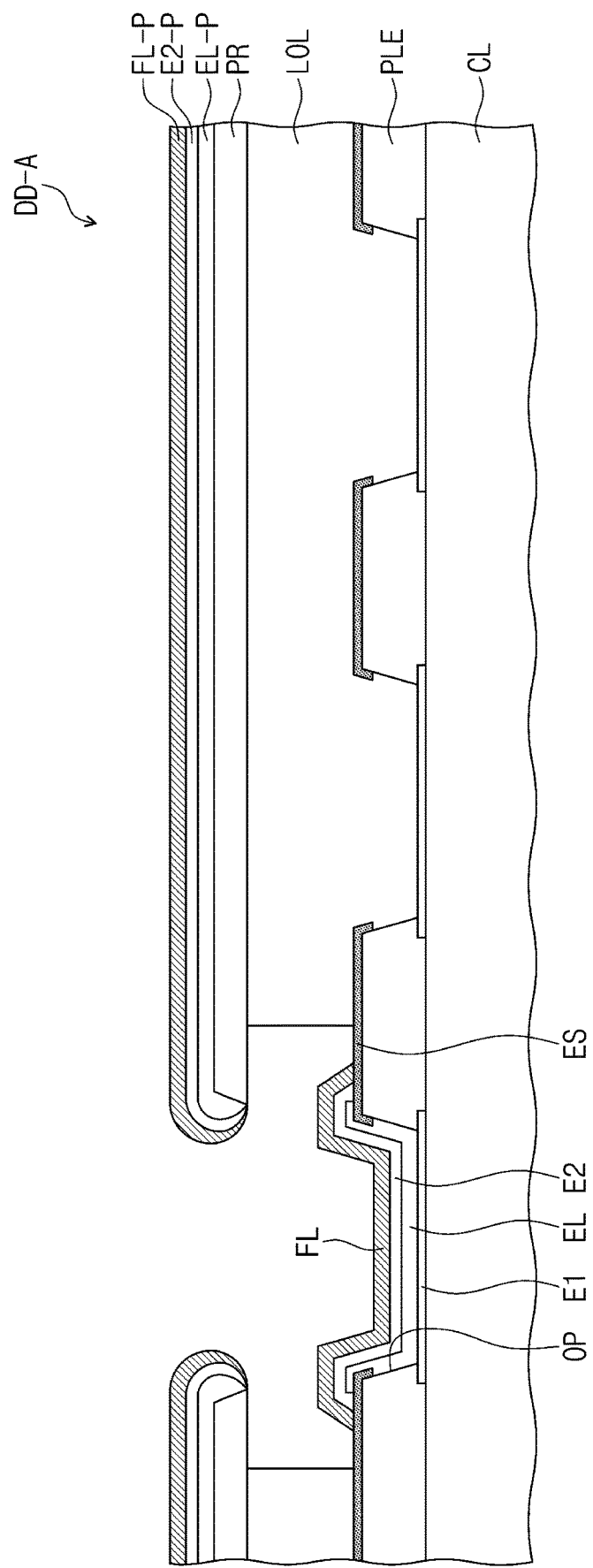

Referring to FIGS. 8D and 8F, the process of forming the organic light emitting element OD may include a process of forming a third deposition layer FL-P on the lift-off layer LOL and the photoresist layer PF and a process of forming a fourth deposition layer SIL-P on the third deposition layer FL-P. According to some example embodiments, the first protection pattern FL may be a layer that is deposited while the third deposition layer FL-P is formed, and the second protection pattern SIL may be a layer that is deposited while the fourth deposition layer SIL-P is formed. Here, for convenience of description, the first protection pattern FL and the second protection pattern SIL are expressed as separate constituents. Thus, the third deposition layer FL-P may have the same tensile stress as that of the first protection pattern FL, and the fourth deposition layer SIL-P may have the same compressive stress as that of the second protection pattern SIL.

According to some example embodiments of the inventive concept, the fourth deposition layer SIL-P covering the under cut UC, may have compressive stress under constant process conditions. The third deposition layer FL-P having the tensile stress that is opposite to the fourth deposition layer SIL-P may be located between a second deposition layer E2-P (see FIG. 8F) and the fourth deposition layer SIL-P, which cover the form of the under cut UC, to prevent or reduce instances of the lift-off layer LOL and the photoresist layer PR being recessed.

Each of the third deposition layer FL-P and the first protection pattern FL according to some example embodiments may have tensile stress of about 0 Mpa to about 200 Mpa.

When each of the third deposition layer FL-P and the first protection pattern FL has tensile stress less than about 0 Mpa, the compressive stress may be applied in the same direction as that of the fourth deposition layer SIL-P to cause the phenomenon in which the lift-off layer LOL and the photoresist layer PR are recessed.

When each of the third deposition layer FL-P and the first protection pattern FL has tensile stress less than about 200 Mpa, larger stress may act in the direction opposite to that in which the lift-off layer LOL and the photoresist layer PR are recessed. As a result, the lift-off layer LOL may be delaminated from the constituents located on the circuit element layer CL such as the auxiliary electrode ES.

Each of the fourth deposition layer SIL-P and the second protection pattern SIL according to some example embodiments may have compressive stress of about −200 Mpa to about 0 Mpa.

When each of the fourth deposition layer SIL-P and the second auxiliary pattern SIL has compressive stress less than about −200 Mpa, compressive stress greater than the tensile stress of the third deposition layer FL-P may act to cause the phenomenon in which the lift-off layer LOL and the photoresist layer PR are recessed.

When each of the fourth deposition layer SIL-P and the second protection pattern SIL has tensile stress exceeding about 0 Mpa, the stress of each of the fourth deposition layer SIL-P and the second protection pattern SIL may act in the same direction as that of the tensile stress of the third deposition layer FL-P to cause the phenomenon in which the lift-off layer LOL is delaminated from the constituents located on the circuit element layer CL such as the auxiliary electrode ES.

The encapsulation layer TFE is located on the organic light emitting element OD. In this embodiment, the encapsulation layer TFE may include a first encapsulation inorganic layer LIL, an encapsulation organic layer OEL, and a second encapsulation inorganic layer UIL.

The first encapsulation layer LIL is located on the display element layer OL. The first encapsulation layer LIL may contact the second protection pattern SIL and a portion of the auxiliary electrode ES, which is exposed from the second protection pattern SIL. The second encapsulation layer UIL is located on the first encapsulation inorganic layer LIL. The first encapsulation inorganic layer LIL and the second encapsulation inorganic layer UIL may seal an organic layer OEL.

Each of the first encapsulation inorganic layer LIL and the second encapsulation inorganic layer UIL may include an inorganic material. For example, each of the first encapsulation inorganic layer LIL and the second encapsulation inorganic layer UIL may include at least one of aluminum oxide (AlOx), silicon oxide (SiOx), silicon nitride (SiNx), silicon oxynitride (SiOxNy), silicon carbide (SiCx), titanium oxide (TiOx), zirconium oxide (ZrOx), or zinc oxide (ZnOx).

The encapsulation organic layer OEL may be located between the first encapsulation inorganic layer LIL and the second inorganic layer UIL. The encapsulation organic layer OEL may include an organic material. For example, the encapsulation layer OEL may include at least one of epoxy, polyimide, polyethylene terephthalate, polycarbonate, polyethylene, or polyacrylate.

The first encapsulation inorganic layer LIL and the second encapsulation inorganic layer UIL may be integrated to be located on the front surface of the display device DD on the plane. According to some example embodiments, each of the first encapsulation inorganic layer LIL and the second encapsulation inorganic layer UIL may partially overlap the encapsulation organic layer OEL. Thus, the first encapsulation inorganic layer LIL and the second encapsulation inorganic layer UIL may be spaced apart from each other in the third direction DR3 with the encapsulation organic layer OEL therebetween on one portion of the area and directly contact each other in the third direction on the other portion of the area. The encapsulation layer TFE may seal the organic light emitting element OD to protect the organic light emitting element OD against foreign substances introduced from the outside.

Figure 5:
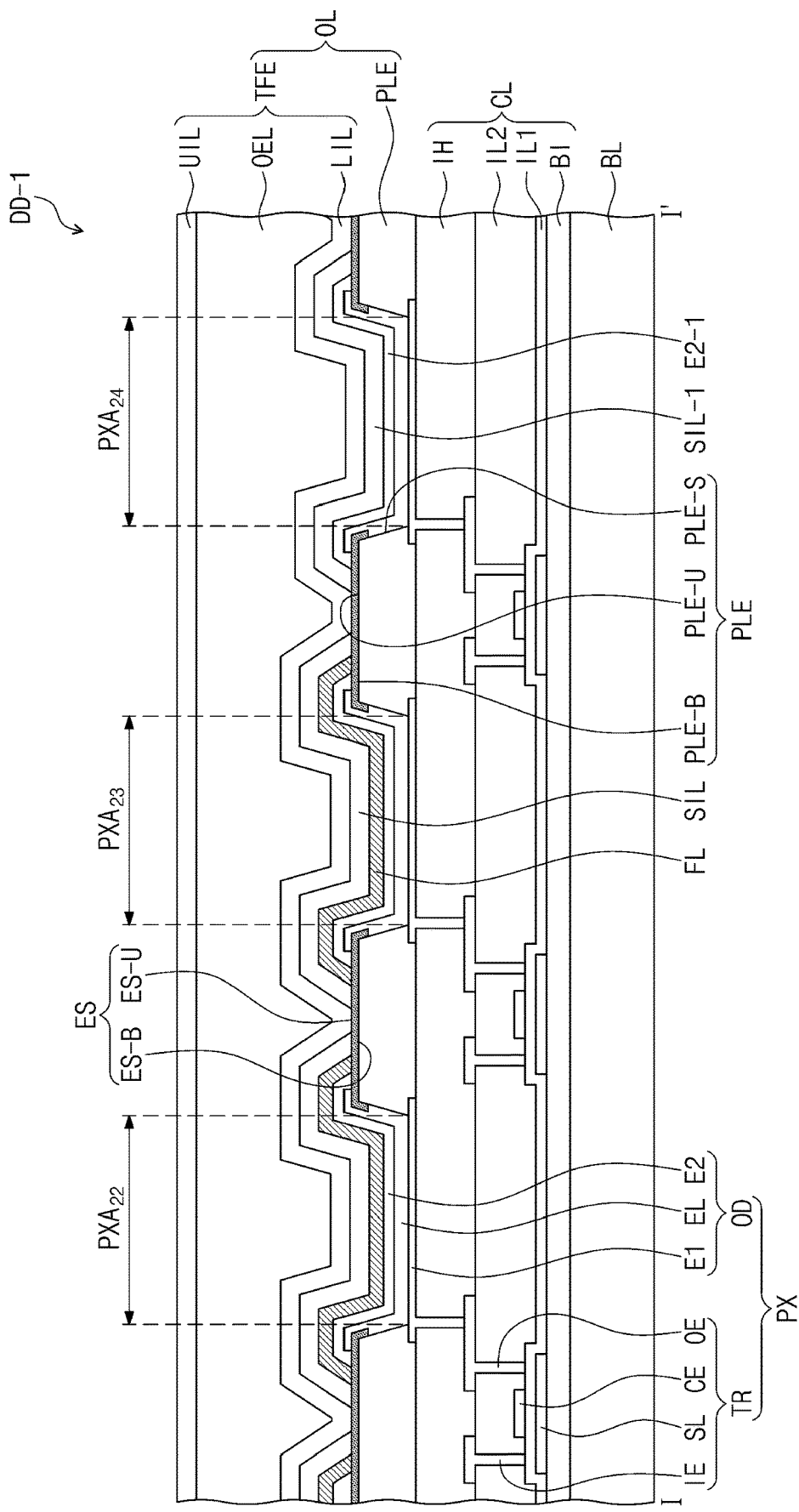
FIG. 5 is a cross-sectional view of a display device according to some example embodiments of the inventive concept.

FIG. 5 is a cross-sectional view of a display device according to some example embodiments of the inventive concept. The same reference numerals are used for the same components as that of FIGS. 1 to 4, and thus, duplicated descriptions will be omitted.

In a display device DD-1 according to some example embodiments, a second electrode E2-1 and a second protection pattern SIL-1 may contact each other on one emission area of emission areas $PXA_{22}$, $PXA_{23}$, and $PXA_{24}$ from which light having colors different from each other are emitted.

For example, one emission area $PXA_{24}$ of the emission areas $PXA_{22}$, $PXA_{23}$, and $PXA_{24}$ may be defined as an emission area to be formed later in the formation process. Because only a single photolithography process is performed on the emission area to be formed later, the first protection pattern FL of FIG. 4 may be omitted on an area overlapping the emission area $PXA_{24}$.

Because the first protection pattern FL has the island pattern shape, one emission area $PXA_{24}$ of the emission areas $PXA_{22}$, $PXA_{23}$, and $PXA_{24}$ may be omitted. Thus, the second electrode E2-1 and the second protection pattern SIL-1 may contact each other on the emission area $PXA_{24}$.

According to some example embodiments, because the first protection pattern FL is omitted on the emission area $PXA_{24}$ on which no subsequent process remains, manufacturing cost and process time for the display device DD-1 may be reduced.

Figure 6:
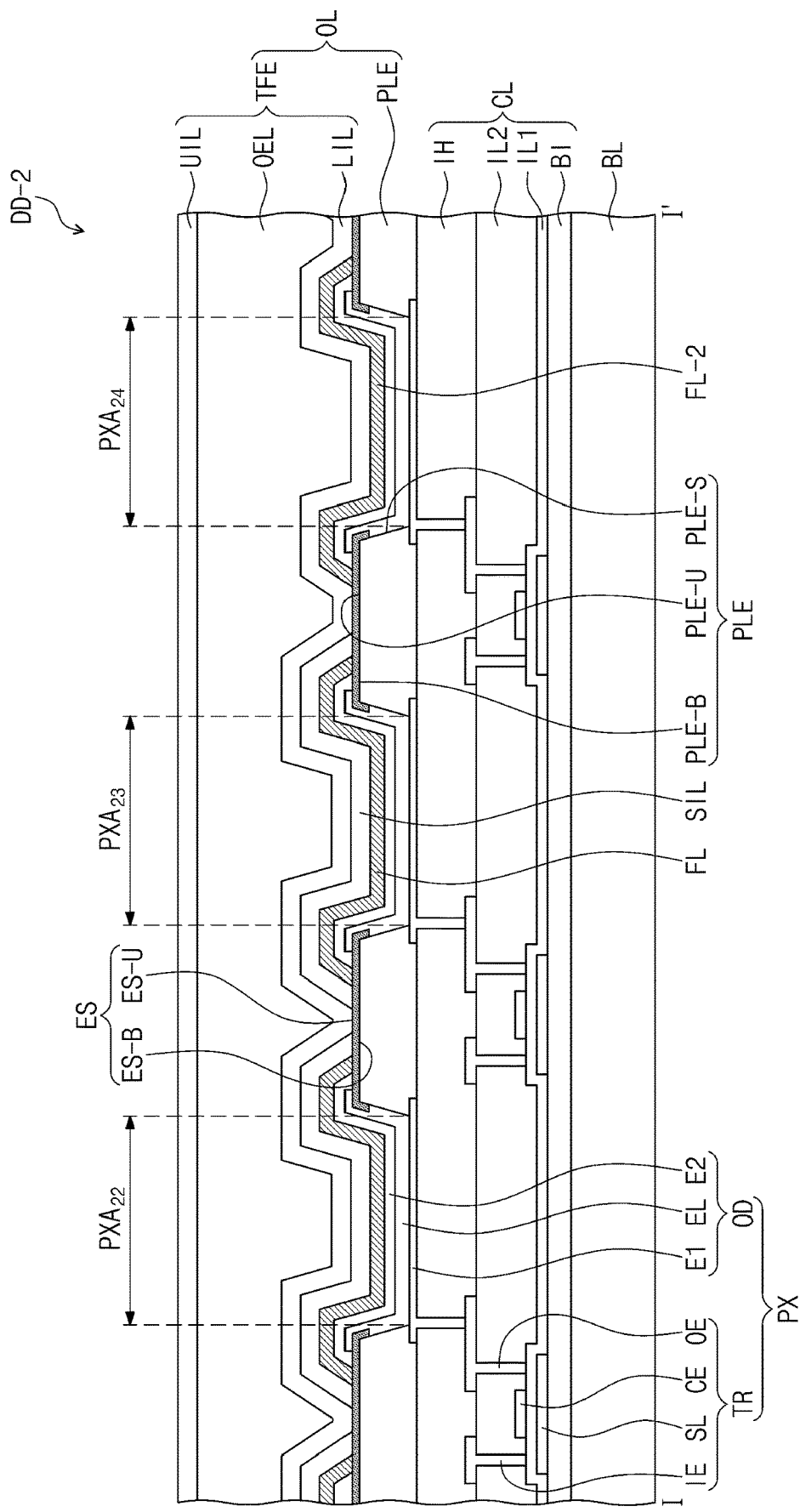
FIG. 6 is a cross-sectional view of a display device according to some example embodiments of the inventive concept.

FIG. 6 is a cross-sectional view of a display device according to some example embodiments of the inventive concept. The same reference numerals are used for the same components as that of FIGS. 1 to 4, and thus, duplicated descriptions will be omitted.

In a display device DD-2 according to some example embodiments, a second protection pattern SIL-2 may contact a first encapsulation inorganic layer LIL of an encapsulation layer TFE on one emission area of emission areas $PXA_{22}$, $PXA_{23}$, and $PXA_{24}$ from which light having colors different from each other are emitted.

For example, one emission area $PXA_{24}$ of the emission areas $PXA_{22}$, $PXA_{23}$, and $PXA_{24}$ may be defined as an emission area to be formed later in the formation process. Because only a single photolithography process is performed on the emission area to be formed later, the second protection pattern SIL of FIG. 4 may be omitted on an area overlapping the emission area $PXA_{24}$. Because the second protection pattern SIL has the island pattern shape, one emission area $PXA_{24}$ of the emission areas $PXA_{22}$, $PXA_{23}$, and $PXA_{24}$ may be omitted. Thus, the second protection pattern SIL-2 may contact a first encapsulation inorganic layer LIL on the emission area $PXA_{24}$.

According to some example embodiments, because the second protection pattern SIL is omitted on the emission area $PXA_{24}$ on which no subsequent process remains, manufacturing cost and process time for the display device DD-2 may be reduced.

Figure 7:
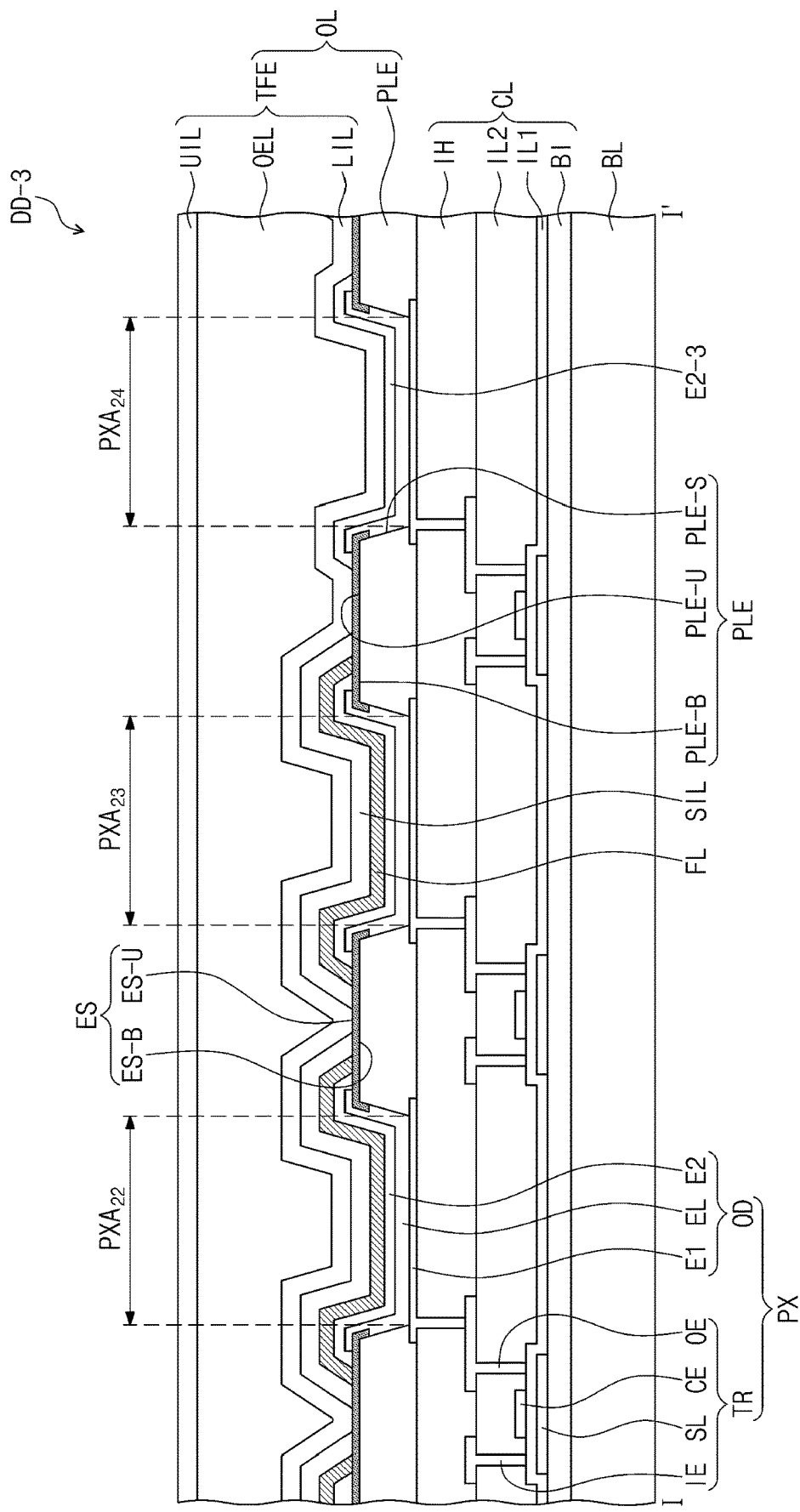
FIG. 7 is a cross-sectional view of a display device according to some example embodiments of the inventive concept.

FIG. 7 is a cross-sectional view of a display device according to some example embodiments of the inventive concept. The same reference numerals are used for the same components as that of FIGS. 1 to 4, and thus, duplicated descriptions will be omitted.

In a display device DD-3 according to some example embodiments, a second electrode E2-3 may contact a first encapsulation inorganic layer LIL of an encapsulation layer TFE on one emission area of emission areas $PXA_{22}$, $PXA_{23}$, and $PXA_{24}$ from which light having colors different from each other are emitted.

For example, one emission area $PXA_{24}$ of the emission areas $PXA_{22}$, $PXA_{23}$, and $PXA_{24}$ may be defined as an emission area to be formed later in the formation process. Because only a single photolithography process is performed on the emission area to be formed later, the first protection pattern FL and the second protection pattern SIL of FIG. 4 may be omitted on an area overlapping the emission area $PXA_{24}$. Because each of the first protection pattern FL and the second protection pattern SIL has the island pattern shape, one emission area $PXA_{24}$ of the emission areas $PXA_{22}$, $PXA_{23}$, and $PXA_{24}$ may be omitted. Thus, the second electrode E2-3 may contact a first encapsulation inorganic layer LIL on the emission area $PXA_{24}$.

According to some example embodiments, because the first protection pattern FL and the second protection pattern SIL are omitted on the emission area $PXA_{24}$ on which no subsequent process remains, manufacturing cost and process time for the display device DD-3 may be reduced.

FIGS. 8A to 8J are cross-sectional views illustrating a method for manufacturing a display device according to some example embodiments of the inventive concept. The same reference numerals are used for the same components as that of FIGS. 1 to 4, and thus, duplicated descriptions will be omitted. Hereinafter, a method for manufacturing a display device according to some example embodiments of the inventive concept will be described with reference to FIGS. 8A to 8J.

A method for manufacturing the display device according to some example embodiments of the inventive concept includes a process of providing a preliminary display device.

Referring to FIG. 8A, a preliminary display device DD-A may be a substrate on which a first electrode E1 connected to a circuit element layer CL, a pixel defining layer PLE in which an opening OP, through which at least a portion of the first electrode E1 is exposed, is defined, and an auxiliary electrode ES covering a portion of the pixel defining layer PLE are formed.

Thereafter, referring to FIG. 8B, the method for manufacturing the display device includes a process of forming a lift-off layer and a process of forming a photoresist layer.

The lift-off layer LOL may be formed on the preliminary display device DD-A. The lift-off layer LOL includes a fluoroplymer. The fluoroplymer contained in the lift-off layer LOL may be formed as a polymer containing fluorine of about 20 wt % to about 60 wt %. For example, the fluoroplymer contained in the lift-off layer LOL may include at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkyl vinyl ether, A copolymer of chlorotrifluoroethylene and perfluoroalkylvinylether, a copolymer of tetrafluoroethylene and perfluoroalkylvinylether, or a copolymer of chlorotrifluoroethylene and perfluoroalkylvinylether.

The lift-off layer LOL may be formed through a coating method, a printing method, a deposition method, and the like. When the lift-off layer LOL is formed through the coating method and the printing method, if necessary, a process of forming a photoresist layer PR after curing and polymerization may be carried out.

The photoresist layer PR is formed on the lift-off layer LOL. The photoresist layer PR is formed by applying a photoresist composite on the lift-off layer LOL. The photoresist layer PR may be either a positive type or a negative type. In this embodiment, the positive type will be described as an example.

Thereafter, referring to FIG. 8C, a process of forming an under cut UC is performed.

The under cut UC may be configured to expose an area of the photoresist layer PR, which overlaps the opening OP, and then etch and remove the photoresist layer PR. Here, a portion of the lift-off layer LOL containing the fluoroplymer may be removed to form the under cut UC.

Thereafter, referring to FIG. 8D, a process of forming an organic pattern EL is performed. The organic pattern EL may be formed in a manner in which a first deposition material containing an organic light emitting material is deposited on a first electrode E1 exposed by the opening OP. The deposition may be performed in a front deposition manner in which a mask is not used. Thus, the first deposition material may be deposited on the portion exposed through the opening OP to form the organic pattern EL and also deposited on the photoresist layer PR to form a first deposition layer EL-P.

The organic pattern EL may be formed as a multilayer by depositing one or more of a hole injection layer, a hole transport layer, an electron transport layer, and an electron injection layer and a light emitting layer. Here, a plurality of deposition materials may be used to deposit the layers. In this case, the first deposition layer EL-P may also be formed as a multilayer.

Thereafter, referring to FIG. 8D, a process of forming a second electrode is performed. The second electrode E2 may be formed to be connected to an auxiliary electrode ES. The second electrode E2 may be formed by applying a second deposition material containing a transparent conductive material on the organic pattern EL exposed by the opening OP. The second electrode E2 may be formed through sputtering, physical vapor deposition (PVD), or plating.

The formation method of the second electrode E2 may be an isotropic method. Thus, the second electrode E2 may have a surface area greater than that of an inlet of the opening OP and be formed to cover an upper portion of the organic pattern EL and a portion of an upper portion of the auxiliary electrode ES. As a result, the second electrode may be electrically connected to the auxiliary electrode ES.

The deposition of the second deposition material may also be performed in the front deposition manner in which a mask is not used. Thus, the second deposition material may be deposited on the organic pattern EL to form the second electrode E2 and also deposited on the first deposition layer EL-P formed on the photoresist layer PR to form a second deposition layer E2-P.

Thereafter, referring to FIG. 8F, a process of forming a first protection pattern is performed. The first protection pattern FL may be formed to be connected to the second electrode E2. The first protection pattern FL may be formed by depositing a third deposition material containing a metal or transparent conductive material on the second electrode E2 exposed by the opening OP.

The formation method of the first protection pattern FL may be an isotropic method. Thus, the first protection pattern FL may have a surface area greater than that of an inlet of the opening OP and be formed to cover an upper portion of the second electrode E2 and a portion of the upper portion of the auxiliary electrode ES. Thus, the first protection pattern FL may complement the electrical connection between the second electrode E2 and the auxiliary electrode ES.

The deposition of the third deposition material may also be performed in the front deposition manner in which a mask is not used. Thus, the third deposition material may be deposited on the second electrode E2 to form the first protection pattern FL and also be deposited on the second deposition layer E2-P formed on the photoresist layer PR to form a third deposition layer FL-P.

Figure 8G:
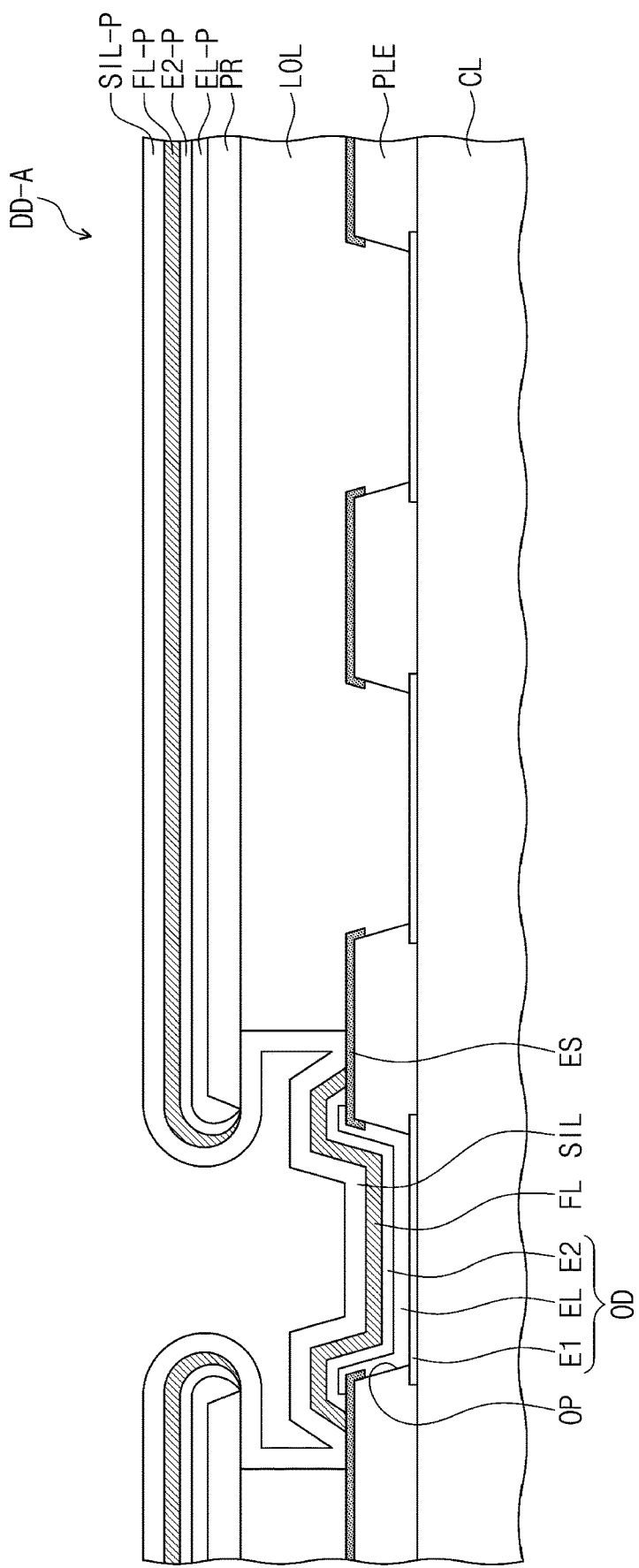

Thereafter, referring to FIG. 8G, a process of forming a second protection pattern is performed. The second protection pattern SIL may be formed to cover the first protection pattern FL. The second protection pattern SIL may be formed by applying a fourth deposition material containing an inorganic material on the first protection pattern FL exposed by the opening OP.

The formation method of the second protection pattern SIL may be an isotropic method. Thus, the second protection pattern SIL may have a surface area greater than that of the inlet of the opening OP and be formed to cover an upper portion of the first protection pattern FL and a portion of the upper portion of the auxiliary electrode ES. Thus, the second protection pattern SIL may serve to protect constituents provided in the organic light emitting element OD against an external impact, an etching material, or external air.

The deposition of the fourth deposition material may also be performed in the front deposition manner in which a mask is not used. Thus, the fourth deposition material may be deposited on the first protection pattern FL to form the second protection pattern SIL and also deposited on the third deposition layer FL-P formed on the photoresist layer PR to form a fourth deposition layer SIL-P.

Thereafter, referring to FIG. 8H, a process of removing the lift-off layer and the photoresist layer is performed. The lift-off layer LOL and the photoresist layer PR may be removed through a lift-off manner using a stripper.

Figure 8I:
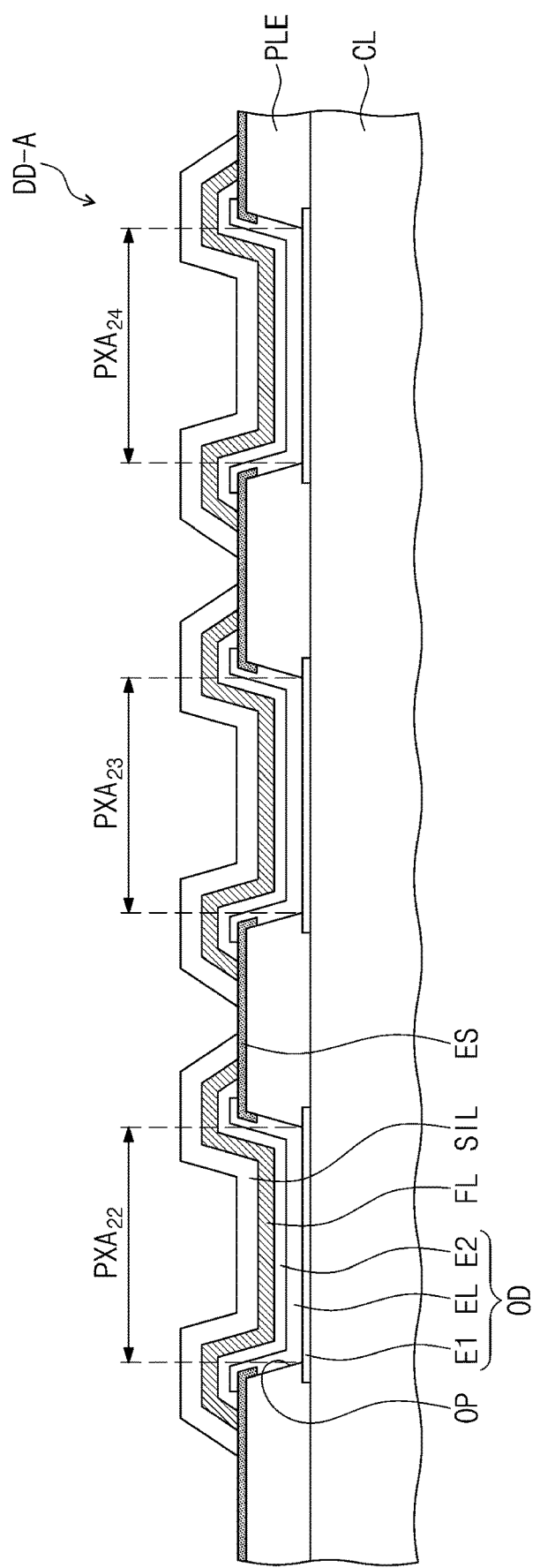

Thereafter, referring to FIG. 8I, the processes of FIGS. 8A to 8H may be repeatedly performed to perform a process of successively forming the organic light emitting element OD on the adjacent emission areas $PXA_{23}$ and $PXA_{24}$.

According to some example embodiments, to prevent or reduce instances of the organic pattern EL provided on the formed emission area $PXA_{22}$ being exposed to the atmosphere, the organic pattern EL containing the inorganic material may be sealed by using the second protection pattern SIL to protect the organic pattern EL against the etching material or external air.

According to some example embodiments of the inventive concept, the second protection pattern SIL may have compressive stress under constant process conditions. Thus, the lift-off layer LOL and the photoresist layer PR may be recessed to cause defect of the organic light emitting element OD.

The third deposition layer FL-P and the first protection pattern FL according to some example embodiments of the inventive concept may have attracting force in a direction that is opposite to the fourth deposition layer SIL-P and the second protection pattern SIL. For example, when each of the fourth deposition layer SIL-P and the second protection pattern SIL has the compressive stress under the constant process conditions, each of the third deposition layer FL-P and the first protection pattern FL may have tensile stress that is opposite to the compressive stress. Thus, the compressive stress of each of the fourth deposition layer SIL-P and the second protection pattern SIL may be offset by the tensile stress of each of the third deposition layer FL-P and the first protection pattern FL to prevent or reduce instances of the lift-off layer LOL and the photoresist layer PR being recessed.

Figure 8J:
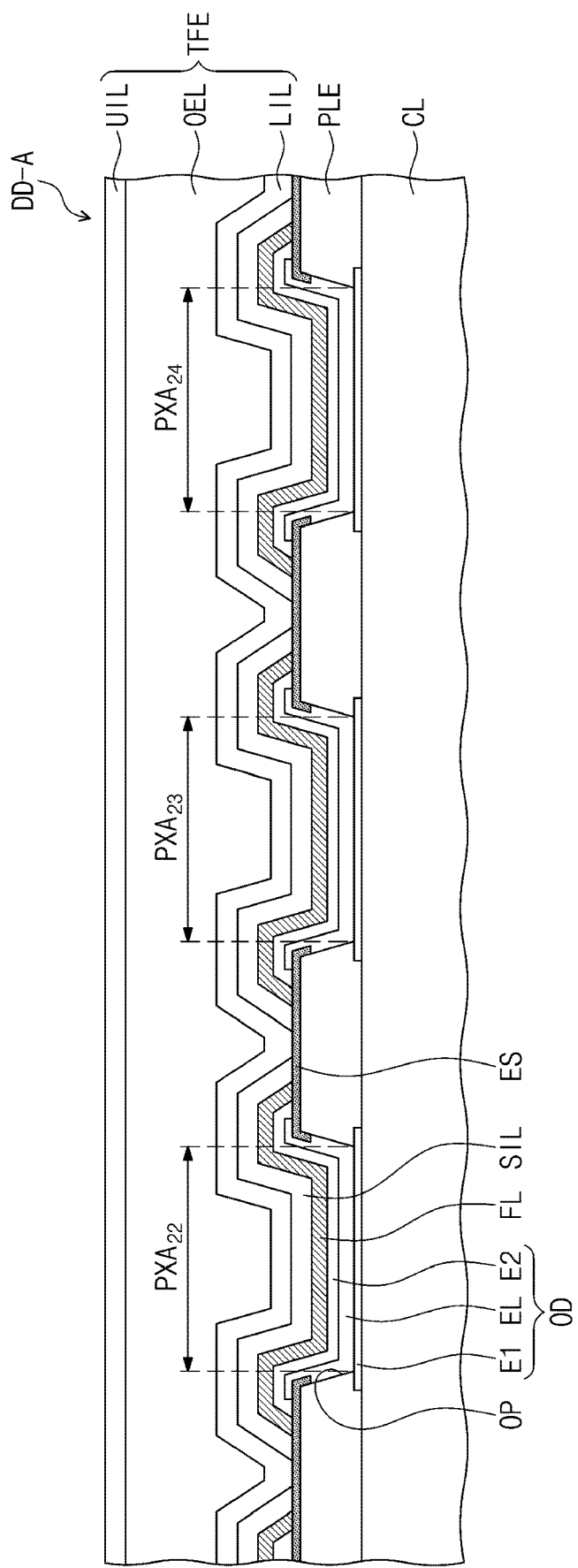

Thereafter, referring to FIG. 8J, a process of forming an encapsulation layer is performed. The encapsulation layer TFE may be formed to cover the entire surface of the organic light emitting elements after the organic light emitting element OD is formed on the emission areas $PXA_{22}$, $PXA_{23}$, and $PXA_{24}$.

According to the embodiments of the inventive concept, the protection patterns having stress in the mutually opposite directions may be arranged to protect the constituents provided in the organic light emitting element against the external impact, the etching material, the external air, or the like when the organic light emitting element is formed. Therefore, the display device having the improved reliability may be provided.

It will be apparent to those skilled in the art that various modifications and variations can be made in the inventive concept. Thus, it is intended that the present disclosure covers the modifications and variations of this invention provided they come within the scope of the appended claims and their equivalents.

Hence, the real protective scope of the inventive concept shall be determined by the technical scope of the accompanying claims and their equivalents.

What is claimed is:

1. A display device comprising:
a circuit element layer comprising a transistor;
a display element layer comprising a first electrode connected to the transistor, a second electrode facing the first electrode, an organic pattern between the first electrode and the second electrode, a pixel defining layer having an opening exposing the first electrode, an auxiliary electrode laterally spaced apart from the opening to cover a portion of the pixel defining layer and connected to the second electrode, a first protection pattern covering the second electrode, and a second protection pattern covering the first protection pattern; and
an encapsulation layer covering the display element layer,
wherein the auxiliary electrode comprises a lower portion and an upper portion opposing the lower portion,
the pixel defining layer comprises a lower portion facing to the transistor, an upper portion opposing the lower portion of the auxiliary electrode,
a whole surface of the upper portion of the pixel defining layer directly contacts the lower portion of the auxiliary electrode, and
wherein the first protection pattern and the second protection pattern have stress in directions different from each other,
wherein a side portion of the first protection pattern is in contact with the upper portion of auxiliary electrode.

2. The display device of claim 1, wherein the first protection pattern comprises a transparent conductive material.

3. The display device of claim 1, wherein the second protection pattern comprises an inorganic material.

4. The display device of claim 1, wherein the first protection pattern has tensile stress, and
the tensile stress of the first protection pattern ranges from 0 Mpa to 200 Mpa.

5. The display device of claim 1, wherein the second protection pattern has compressive stress, and
the compressive stress of the second protection pattern ranges from −200 Mpa to 0 Mpa.

6. The display device of claim 1, wherein the first protection pattern has a thickness greater than that of the second electrode and less than that of the second protection pattern.

7. The display device of claim 6, wherein the first protection pattern has a thickness of 500 Å to 3,000 Å, and
the second protection pattern has a thickness of 3,000 Å to 20,000 Å.

8. The display device of claim 1, wherein the encapsulation layer comprises a first encapsulation inorganic layer, a second encapsulation inorganic layer, and an encapsulation organic layer between the first encapsulation inorganic layer and the second encapsulation inorganic layer, each of which contains an inorganic material, and
the first encapsulation inorganic layer contacts the second protection pattern and a portion of the auxiliary electrode, which is exposed from the second protection pattern.

9. The display device of claim 1, wherein the remaining portion of the upper portion is covered by a portion of each of the organic pattern, the second electrode, the first protection pattern, and the second protection pattern.

10. The display device of claim 1, wherein surface areas gradually increase in order of the organic pattern, the second electrode, the first protection pattern, and the second protection pattern.

11. The display device of claim 1, wherein each of the pixel defining layer and the auxiliary electrode has an island pattern shape on a plane.

12. A display device comprising:
a circuit element layer comprising a transistor;
a display element layer comprising a first electrode connected to the transistor, a second electrode facing the first electrode, an organic pattern between the first electrode and the second electrode, a pixel defining layer having an opening exposing the first electrode, an auxiliary electrode laterally spaced apart from the opening to cover a portion of the pixel defining layer and connected to the second electrode such that the auxiliary electrode is between the second electrode and the pixel defining layer, a first protection pattern covering the second electrode, and a second protection pattern covering the first protection pattern; and
an encapsulation layer covering the display element layer,
wherein the auxiliary electrode comprises a lower portion and an upper portion opposing the lower portion,
the pixel defining layer comprises a lower portion facing to the transistor, an upper portion opposing the lower portion of the auxiliary electrode,
a whole surface of the upper portion of the pixel defining layer directly contacts the lower portion of the auxiliary electrode, and
wherein the first protection pattern comprises transparent conductive oxide, and the second protection pattern comprises an inorganic material,
wherein a side portion of the first protection pattern is in contact with the upper portion of the auxiliary electrode.

13. The display device of claim 12, wherein the first protection pattern and the second protection pattern have stress different from each other.

14. The display device of claim 12, wherein the first protection pattern has a thickness less than that of the second protection pattern.

15. The display device of claim 13, wherein the first protection pattern has a thickness of 500 Å to 3,000 Å, and
the second protection pattern has a thickness of 3,000 Å to 20,000 Å.

16. The display device of claim 12, wherein the first protection pattern comprises a transparent conductive material, the transparent conductive material comprises at least one of zinc oxide (ZnO), tin oxide ($SnO_2$), indium zinc oxide (IZO), indium tin oxide (ITO), or indium gallium oxide (IGO).

17. The display device of claim 12, wherein the inorganic material comprises at least one of silicon nitride ($SiN_x$), silicon oxynitride ($SiO_xN_y$), silicon oxide ($SiO_x$), silicon carbide ($SiC_x$), titanium oxide ($TiO_x$), zirconium oxide ($ZrO_x$), or zinc oxide ($ZnO_x$).

* * * * *